US008976838B2

(12) United States Patent
Jaeckel et al.

(10) Patent No.: US 8,976,838 B2
(45) Date of Patent: Mar. 10, 2015

(54) APPARATUS FOR ASSIGNING AND ESTIMATING TRANSMISSION SYMBOLS

(75) Inventors: Stephan Jaeckel, Berlin Charlottenburg (DE); Volker Jungnickel, Berlin (DE); Thomas Schierl, Berlin (DE); Cornelius Hellge, Berlin (DE); Thomas Haustein, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 1007 days.

(21) Appl. No.: 12/970,990

(22) Filed: Dec. 17, 2010

(65) Prior Publication Data

US 2011/0129025 A1 Jun. 2, 2011

Related U.S. Application Data

(63) Continuation of application No. PCT/EP2009/004488, filed on Jun. 22, 2009.

(30) Foreign Application Priority Data

Jun. 20, 2008 (DE) .......................... 10 2008 029 353

(51) Int. Cl.
*H04B 1/69* (2011.01)
*H04L 27/28* (2006.01)
(Continued)

(52) U.S. Cl.
CPC ........... *H04L 1/0017* (2013.01); *H03M 13/356* (2013.01); *H04L 1/0003* (2013.01);
(Continued)

(58) Field of Classification Search
CPC .................. H04N 19/00436; H04N 19/00442; H04N 19/00424; H04N 21/2662; H04N 19/00448; H04N 21/2383; H04N 21/4382; H04N 21/6131; H04N 19/00084; H04N 21/631; H04N 7/152; H04N 21/4347; H04N 19/00533; H04N 19/0069; H04N 21/2365; H04N 21/440227; H04N 19/00018; H04N 21/23614; H04N 19/00181; H04N 19/00418; H04N 17/004; H04N 19/00672; H04N 21/2402; H04N 19/00242; H04L 1/0057; H04L 1/007; H04L 2001/0098; H04L 12/189; H04L 12/5695; H04L 1/0045; H04L 1/0009; H04L 1/0014; H04L 47/14; H04L 2012/5679; H04L 25/03159; H04L 27/34; H04L 47/19; H04L 47/2433; H04L 67/1078; H04L 67/32
See application file for complete search history.

(56) References Cited

U.S. PATENT DOCUMENTS

| 7,920,884 B2 | 4/2011 | Agrawal et al. |
| 2002/0064173 A1 | 5/2002 | Watanabe |

(Continued)

FOREIGN PATENT DOCUMENTS

| CN | 1993916 A | 7/2007 |
| EP | 1 895 732 A1 | 3/2008 |

(Continued)

OTHER PUBLICATIONS

Official Communication issued in corresponding Japanese Patent Application No. 2011-513959, mailed on May 14, 2013.

(Continued)

*Primary Examiner* — Tesfaldet Bocure
(74) *Attorney, Agent, or Firm* — Keating & Bennett, LLP

(57) ABSTRACT

An apparatus for assigning transmission symbols to a media data stream of information symbols is described, the media data stream including a first substream for representing media content in a basic quality and a second substream including additional data for representing the media content, along with the first substream, in an improved quality. The apparatus includes a first assigner for assigning first transmission symbols to the information symbols of the first substream and a second assigner for assigning second transmission symbols to the information symbols of the second substream, the first transmission symbols being transmissible, via a transmission channel, with reduced error probability as compared to the second transmission symbols.

17 Claims, 11 Drawing Sheets

(51) Int. Cl.

| | | |
|---|---|---|
| *H04J 11/00* | (2006.01) | |
| *H04L 1/00* | (2006.01) | |
| *H03M 13/35* | (2006.01) | |
| *H04L 5/00* | (2006.01) | |
| *H04L 27/18* | (2006.01) | |
| *H04L 27/26* | (2006.01) | |
| *H04L 27/34* | (2006.01) | |
| *H04N 19/33* | (2014.01) | |
| *H04L 1/06* | (2006.01) | |
| *H04L 25/02* | (2006.01) | |
| *H04L 25/03* | (2006.01) | |
| *H04L 29/06* | (2006.01) | |

(52) U.S. Cl.
CPC ............ *H04L 1/007* (2013.01); *H04L 5/0064* (2013.01); *H04L 27/183* (2013.01); *H04L 27/2604* (2013.01); *H04L 27/3488* (2013.01); *H04N 19/00436* (2013.01); *H04L 1/0625* (2013.01); *H04L 5/0048* (2013.01); *H04L 25/022* (2013.01); *H04L 25/03159* (2013.01); *H04L 2001/0098* (2013.01); *H04L 65/607* (2013.01)
USPC ........... 375/141; 375/146; 375/147; 375/260; 370/210

(56) References Cited

U.S. PATENT DOCUMENTS

| | | | |
|---|---|---|---|
| 2006/0013168 | A1 | 1/2006 | Agrawal et al. |
| 2007/0165705 | A1 | 7/2007 | Coon |
| 2008/0089354 | A1* | 4/2008 | Yoon et al. ............... 370/432 |
| 2010/0039928 | A1* | 2/2010 | Noh et al. ................ 370/210 |
| 2013/0343468 | A1* | 12/2013 | Ko et al. ................ 375/240.25 |

FOREIGN PATENT DOCUMENTS

| | | |
|---|---|---|
| EP | 1 928 115 A1 | 6/2008 |
| JP | 8-265295 A | 10/1996 |
| JP | 2002-164866 A | 6/2002 |
| JP | 2008-502220 A | 1/2008 |
| WO | 2005-122627 A1 | 12/2005 |

OTHER PUBLICATIONS

NTT DoCoMo et al., "Investigations on Adaptive Control of Roll-off Factor for DFT-Spread OFDM Based SC-FDMA in E-UTRA Uplink," 3GPP TSG RAN WG1 Meeting #46bls, Oct. 9-13, 2006, pp. 1-5.
Wu et al., "Adaptive Multi-User Resource Allocation Using DFT-Precoded OFDM," 7th International ITG Conference on Source and Channel Coding (SCC), Jan. 16, 2008, 8 pages.
Sun et al., "An Adaptive DFT-SOFDM for Future Cellular Systems," Communications, Circuits and Systems Proceedings, vol. 2, Jun. 28, 2008, 6 pages.
Han et al., "An Overview of Peak-to-Average Power Ratio Reduction Techniques for Multicarrier Transmission", IEEE Wireless Communications, Apr. 2005, pp. 56-65.
Hassibi et al., "High-Rate Codes That Are Linear in Space and Time", IEEE Transactions on Information Theory, vol. 48, No. 7, Jul. 2002, pp. 1804-1824.
Jaeckel et al., "On the Optimality of Frequency-Domain Equalization in DFT-Spread MIMO-OFDM Systems", IEEE Communications Society, the WCNC 2008 proceedings, pp. 1172-1177.
Jungnickel et al., "Capacity Measurements in a Multicell MIMO System", 2006, pp. 1-6.
Schierl et al., "Mobile Video Transmission Using Scalable Video Coding", IEEE Transactions on Circuits and Systems for Video Technology, vol. 17, No. 9, Sep. 2007, pp. 1204-1217.
Shamai et al., "Enhancing the Cellular Downlink Capacity via Co-Processing at the Transmitting End", 2001 IEEE, pp. 1745-1749.
Telatar, "Capacity of Multi-antenna Gaussian Channels", European Transactions on Telecommunications, vol. 10, No. 6, pp. 585-595, Nov.-Dec. 1999.
van Zelst, "Space Division Multiplexing Algorithms", Proc. IEEE MeleCon '00, vol. 3, pp. 1218-1221, 2000.
Official Communication issued in corresponding European Patent Application No. 09 765 648.2, mailed on Aug. 5, 2011.
Jungnickel et al., "SC-FDMA Waveform Design, Performance, Power Dynamics and Evolution to MIMO," IEEE International Conference on Portable Information Devices, May 1, 2007, pp. 1-6.
Official Communication issued in corresponding Japanese Patent Application No. 2011-513959, mailed on Sep. 11, 2012.
Chia et al., "Distributed DFT-Spread OFDM," IEEE Singapore International Conference, Oct. 2006, pp. 1-7.
Chia et al., "A Transceiver Scheme for Localized DFT Spread OFDM (DFT-SOFDM) in Time-Selective Channel," 3rd International Symposium, May 9, 2008, pp. 83-87.
Kimoto, "Activity on Scalable Video Coding in MPEG," Information Processing Society of Japan Technical Report, Mar. 11, 2005, vol. 2005, No. 23, pp. 55-60.
Official Communication issued in corresponding Chinese Patent Application No. 200980132300.2, mailed on Mar. 12, 2013.
Official Communication issued in International Patent Application No. PCT/EP2009/004488, mailed on Aug. 31, 2010.
Wu et al., "Comparison of Terrestrial DTV Transmission Systems: The ATSC 8-VSB, The DVB-T COFDM, and the ISDB-T BST-OFDM," IEEE Transactions on Broadcasting, Jun. 2000, vol. 46, No. 2, pp. 101-113.
Chari et al., "Flo Physical Layer: An Overview," IEEE Transactions on Broadcasting, Mar. 2007, vol. 53, No. 1, pp. 145-160.
Deb et al., "Real-Time Video Multicast in WiMax Networks," IEEE Conference on Computer Communications, Apr. 2008, pp. 2252-2260.
Correia et al., "Multi-Resolution Broadcast/Multicast Systems for MBMS," IEEE Transactions on Broadcasting, Mar. 2007, vol. 53, No. 1, pp. 224-234.

* cited by examiner $$(1) \quad \vec{x}_n = \frac{1}{\sqrt{N}} \sum_{m=1}^{N_{dft}} W_{n,m} \cdot \vec{d}_m$$

$$(1.1) \quad W_{n,m} = \exp\left(-2\Pi j \frac{(n-1)(m-1)}{N}\right)$$

$$(2) \quad \vec{y}_n = H_n \cdot \vec{x}_n + \vec{v}_n$$

$$(3) \quad \hat{\vec{d}}_m = \frac{1}{\sqrt{N}} \sum_{n=1}^{N} W_{n,m}^* \left(\frac{n_{t_x}}{SNR} \cdot I_{n_{t_x}} + H_n^H H_n\right)^{-1} \cdot H_n \cdot \vec{y}_n$$

$$(4) \quad \sum_{s=1}^{S} N_s \leq N$$

$$(5) \quad E\left(\sum_{s=1}^{S} \frac{1}{N_s} \sum_{n=1}^{N_s} \sum_{t=1}^{n_{Tx}} X_{s,t,n} \cdot X_{s,t,n}^*\right) \leq P_{Tx}$$

$$(6) \quad PAPR = \frac{peak\_power}{average\_power} = \frac{\max_k = 1 \ldots N \cdot T \; |x(k)|^2}{\frac{1}{N \cdot T} \sum_{k=1}^{N \cdot T} |x(k)|^2}$$

FIGURE 11

APPARATUS FOR ASSIGNING AND ESTIMATING TRANSMISSION SYMBOLS

CROSS-REFERENCE TO RELATED APPLICATIONS

This application is a continuation of copending German Application No. 102008029353.9-55, filed Jun. 20, 2008, which is incorporated herein by reference in its entirety.

The present invention relates to transmitting data streams composed of substreams of different levels of significance, as is the case in a scalable video codec, for example.

BACKGROUND OF THE INVENTION

In radio networks, for example in mobile radio networks, transmission errors typically depend on the quality of reception. Several concepts have already been known in the field of conventional technology which improve the error-proneness of data transmissions, for example by taking advantage of diversity. For example, current radio transmission systems such as UMTS (universal mobile telecommunication systems), HSPA (high speed packet access), LTE (long term evolution), etc. are trying to make use of the available transmission bandwidth as well as possible by adapting a user's data transmission rate to the channel quality. For this purpose, loops may be used, i.e. a user measures the channel and reports the channel state, so-called CSI (channel state information), to the network, i.e. to a base station or node B.

Modern transmission techniques such as utilizing several transmit or receive antennas, so-called MIMO (multiple input multiple output), space-time multiplexing, so-called space-time codes (STC) or spreading techniques, for example, are used for increasing transmission rates, or for increasing coverage or rendering it more reliable.

In the field of multimedia applications, transmission of audio and video data is becoming increasingly important; for example, coding methods are constantly being developed further. In the field of video coding, concepts of scalable video coding, cf. AVC (advanced video coding) and SVC (scalable video codec) have been known, which also endeavor to make use of an available data rate as well as possible.

Video transmission in mobile radio networks constitutes a problem. Since video broadcasting, such as television programs, is constituted by broadcasting data, no individual feedbacks on the part of subscribers are available. In other words, a broadcast transmission is directed at a multitude of users, which does not allow obtaining individual feedback on a transmission quality from each user. Conventional concepts enabling broadband wireless video transmission in cellular mobile radio architectures at low transmit power both with a large range of transmission and with a high level of failure safety cannot be used in the case of broadcasting due to lack of feedback from the individual subscribers.

Frequency-selective multipath channels place high requirements on the transmission methods. New techniques such as MIMO, frequency-selective scheduling as well as space-time coding, for example, may often use feedback on the channel quality at the receiver in order to be able to be used in an optimum manner.

Conventional broadcasting concepts use DVB (digital video broadcast), for example; specifically, e.g. for DVB-T (T=terrestrial) television. For example, in this concept several exposed locations are used as base stations, and a video signal coded by means of MPEG-2 (Moving Pictures Expert Group 2) is emitted by means of a multi-carrier process such as OFDM (orthogonal frequency division multiplexing). However, the broadband radio channel is subject to the propagation conditions that are typical for mobile radiocommunication. Due to the multipath propagation, parts of the signal may erase themselves by destructive superposition and may induce so-called fast fading. The resulting transmission or bit errors at the receiver may be corrected by adding redundancy, i.e. within the context of channel coding—however, this will be at the price of slower transmission rates.

Shadowings of direct line-of-sight links, which may also be referred to as slow fading, may lead to considerable drops in the receiving power, even in small regions, in the order of magnitudes of several meters. To counteract this, high transmit powers are sometimes used for DVB-T, for example more than 100 kW at a bandwidth of 5 MHz. Nevertheless, the term "mobile television" is justified only in the vicinity of the base station, i.e. up to a distance of several kilometers from same. If larger distances are to be covered, antennas specifically directed to the transmitter may be used in most cases.

SUMMARY

According to an embodiment, a transmitter including an apparatus for assigning transmission symbols to a media data stream of information symbols, the media data stream including a first substream for representing a media content in a basic quality and a second substream including additional data for representing the media content, along with the first data stream, in an improved quality, may have: a first assigner for assigning first transmission symbols to the information symbols of the first substream; a second assigner for assigning second transmission symbols to the information symbols of the second substream, the first transmission symbols being transmissible, via a transmission channel, with reduced error probability as compared to the second transmission symbols; and an assigner for assigning radio resources that are adapted to assign radio resources to the first transmission symbols and to the second transmission symbols, and to balance off variable data rates of the first substream and of the second substream; the transmitter being configured to transmit the first and second transmission symbols as broadcast transmissions, and the transmitter further including: a frequency spreader configured to superimpose the transmission symbols of the first and/or second substream(s) in a shared frequency range, respectively, and an OFDM (orthogonal frequency division multiplexing) transmitter configured to transmit the transmission symbols—superimposed in the shared frequency range—via a radio channel as the transmission channel.

According to another embodiment, a method of assigning radio resources to transmission symbols, and assigning transmission symbols to a media data stream of information symbols, the media data stream including a first substream for representing a media content in a basic quality and a second substream including additional data for representing the media content, along with the first data stream, in an improved quality, may have the steps of: assigning first transmission symbols to the information symbols of the first substream; assigning second transmission symbols to the information symbols of the second substream, the first transmission symbols being transmissible, via a transmission channel, with reduced error probability as compared to the second transmission symbols; assigning radio resources to the first transmission symbols and to the second transmission symbols to balance off variable data rates of the first substream and of the second substream; transmitting the first and second transmission symbols as broadcast transmissions, specifically by means of frequency spreading, wherein the transmission symbols of the first and/or second substream(s) are superimposed in a shared frequency range, respectively, and OFDM (orthogonal frequency division multiplexing) transmission, wherein the transmission symbols—superimposed in the shared frequency range—are transmitted via a radio channel as the transmission channel.

According to another embodiment, a computer program may have a program code for performing the method of assigning radio resources to transmission symbols, and assigning transmission symbols to a media data stream of information symbols, the media data stream including a first substream for representing a media content in a basic quality and a second substream including additional data for representing the media content, along with the first data stream, in an improved quality, which method may have the steps of: assigning first transmission symbols to the information symbols of the first substream; assigning second transmission symbols to the information symbols of the second substream, the first transmission symbols being transmissible, via a transmission channel, with reduced error probability as compared to the second transmission symbols; assigning radio resources to the first transmission symbols and to the second transmission symbols to balance off variable data rates of the first substream and of the second substream; transmitting the first and second transmission symbols as broadcast transmissions, specifically by means of frequency spreading, wherein the transmission symbols of the first and/or second substream(s) are superimposed in a shared frequency range, respectively, and OFDM (orthogonal frequency division multiplexing) transmission, wherein the transmission symbols—superimposed in the shared frequency range—are transmitted via a radio channel as the transmission channel, when the program code runs on a computer or processor.

According to another embodiment, an apparatus for estimating a media data stream on the basis of a stream of receive symbols may have: a demultiplexer for splitting up the stream of receive symbols into at least a first symbol substream and a second symbol substream; a first symbol estimator for associating a first substream of information symbols of the media data stream with the first symbol substream on the basis of a first symbol alphabet; and a second symbol estimator for associating a second substream of information symbols of the media data stream with the second symbol substream on the basis of a second symbol alphabet, the first substream allowing a media content to be represented in a basic quality, and the second substream along with the first substream allowing the media content to be represented in an improved quality, the receiver further including an OFDM receiver, and the demultiplexer being configured to perform, within the context of splitting, frequency despreading on the receive symbols.

Another embodiment may have a receiver including an apparatus for estimating a media data stream on the basis of a stream of receive symbols, which apparatus may have: a demultiplexer for splitting up the stream of receive symbols into at least a first symbol substream and a second symbol substream; a first symbol estimator for associating a first substream of information symbols of the media data stream with the first symbol substream on the basis of a first symbol alphabet; and a second symbol estimator for associating a second substream of information symbols of the media data stream with the second symbol substream on the basis of a second symbol alphabet, the first substream allowing a media content to be represented in a basic quality, and the second substream along with the first substream allowing the media content to be represented in an improved quality, the receiver further including an OFDM receiver, and the demultiplexer being configured to perform, within the context of splitting, frequency despreading on the receive symbols.

According to another embodiment, a method of estimating a media data stream on the basis of a stream of receive symbols may have the steps of: splitting up the stream of receive symbols into at least a first symbol substream and a second symbol substream; associating a first substream of information symbols of the media data stream with the first symbol substream on the basis of a first symbol alphabet; and associating a second substream of information symbols of the media data stream with the second symbol substream on the basis of a second symbol alphabet, the first substream allowing a media content to be represented in a basic quality, and the second substream along with the first substream allowing the media content to be represented in an improved quality, the method further including OFDM reception, and frequency despreading is performed on the receive symbols within the context of splitting.

Another embodiment may have a computer program including a program code for performing the method of estimating a media data stream on the basis of a stream of receive symbols, which method may have the steps of: splitting up the stream of receive symbols into at least a first symbol substream and a second symbol substream; associating a first substream of information symbols of the media data stream with the first symbol substream on the basis of a first symbol alphabet; and associating a second substream of information symbols of the media data stream with the second symbol substream on the basis of a second symbol alphabet, the first substream allowing a media content to be represented in a basic quality, and the second substream along with the first substream allowing the media content to be represented in an improved quality, the method further including OFDM reception, and frequency despreading is performed on the receive symbols within the context of splitting, when the program code runs on a computer or a processor.

Another embodiment may have a system including a transmitter including an apparatus for assigning transmission symbols to a media data stream of information symbols, the media data stream including a first substream for representing a media content in a basic quality and a second substream including additional data for representing the media content, along with the first data stream, in an improved quality, which transmitter may have: a first assigner for assigning first transmission symbols to the information symbols of the first substream; a second assigner for assigning second transmission symbols to the information symbols of the second substream, the first transmission symbols being transmissible, via a transmission channel, with reduced error probability as compared to the second transmission symbols; and an assigner for assigning radio resources that are adapted to assign radio resources to the first transmission symbols and to the second transmission symbols, and to balance off variable data rates of the first substream and of the second substream; the transmitter being configured to transmit the first and second transmission symbols as broadcast transmissions, and the transmitter further including: a frequency spreader configured to superimpose the transmission symbols of the first and/or second substream(s) in a shared frequency range, respectively, and an OFDM (orthogonal frequency division multiplexing) transmitter configured to transmit the transmission symbols—superimposed in the shared frequency range—via a radio channel as the transmission channel, and a receiver including an apparatus for estimating a media data stream on the basis of a stream of receive symbols, which apparatus may have: a demultiplexer for splitting up the stream of receive symbols into at least a first symbol substream and a second symbol substream; a first symbol estimator for associating a first substream of information symbols of the media data stream with the first symbol substream on the basis of a first symbol alphabet; and a second symbol estimator for associating a second substream of information symbols of the media data stream with the second symbol substream on the basis of a second symbol alphabet, the first substream allowing a media content to be represented in a basic quality, and the second substream along with the first substream allowing the media content to be represented in an improved quality, the receiver further including an OFDM receiver, and the demultiplexer being configured to perform, within the context of splitting, frequency despreading on the receive symbols.

The present invention is based on the knowledge that substreams of scalable coding methods may be modulated differently. The available radio resources may thus be employed more efficiently and be adapted to the levels of significance of the substreams. For example, a scalable video coding process such as H.264/SVC, for example, may comprise an adaptation to the source. For example, by means of spreading, space-time coding and adaptation of the modulation process to the video signal, embodiments may enable a large video bandwidth and, simultaneously, failure safety and a large range of transmission. In embodiments, existing mobile radio infrastructure may be used for this purpose, for example, which may also be operated at a low transmit power, depending on the embodiment.

In other words, it is the core idea of the present invention that, e.g., concepts that are known from mobile radio systems and concepts that are known, e.g., from video coding, are combined such that adaptive, flexible and reliable broadcast transmission to a multitude of users is made possible.

BRIEF DESCRIPTION OF THE DRAWINGS

Embodiments of the present invention will be detailed subsequently referring to the appended drawings, in which:

FIG. 11 shows equations relevant to illustrating the embodiments.

DETAILED DESCRIPTION OF THE INVENTION

Figure 1:
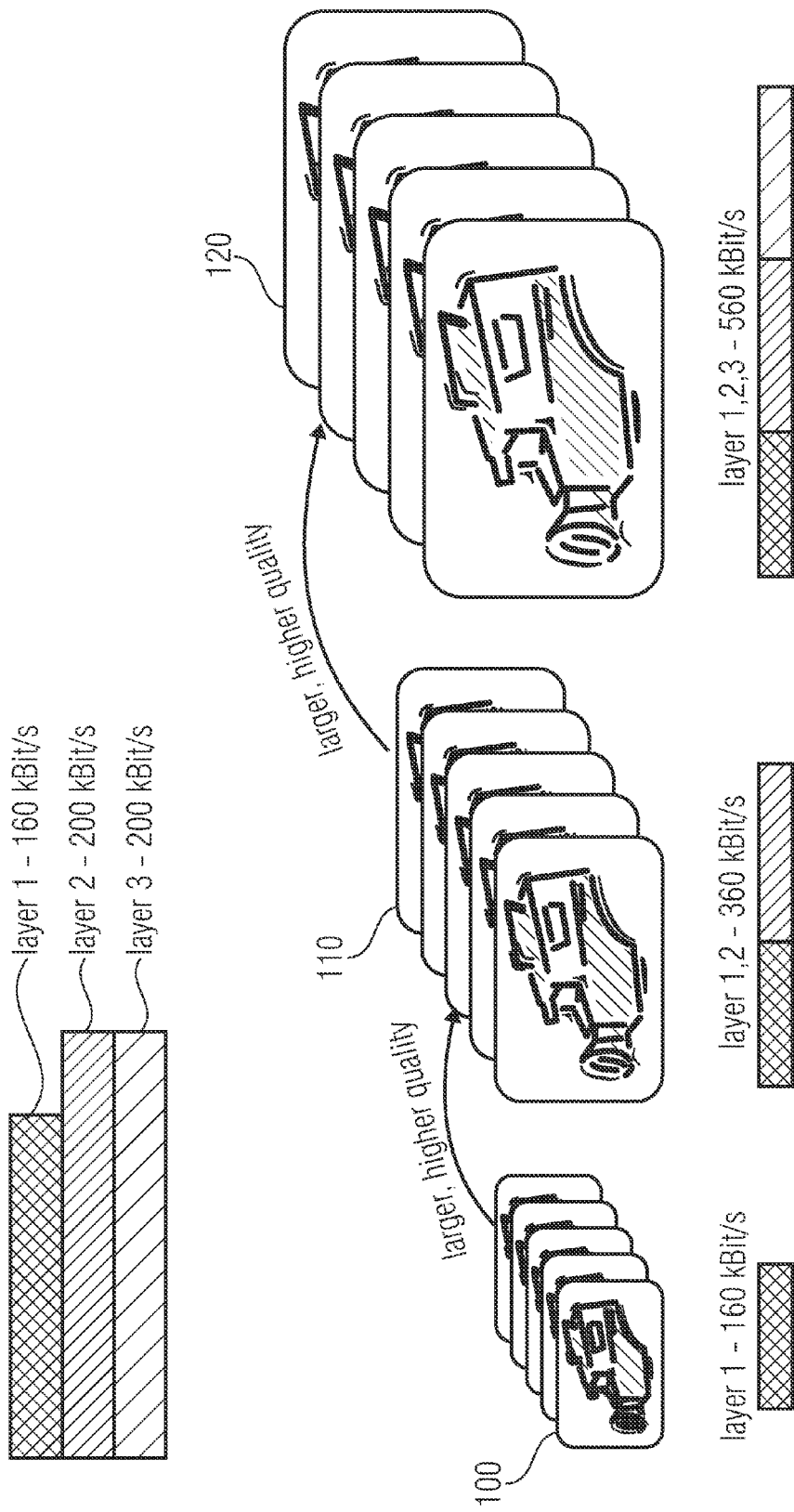
FIG. 1 shows an embodiment of the fundamental structure of scalable video coding.

SVC is an upgrade of the H.264/AVC video compression standard, cf. ITU-T Recommendation H.264 and ISO/IEC 14496-10 (MPEG-4 AVC), Advanced video coding for generic audiovisual services—version 8 (including SVC extension), ITU-T and ISO/IEC JTC 1, 07 2007). SVC allows efficient scaling of temporal, spatial and quality resolutions in a video signal. Scalability is achieved when parts of the data stream may be lost, the residual signal nevertheless allowing the video signal to be decoded. This is shown, by way of example, in the embodiment of scalable video coding, said embodiment being shown in FIG. 1. The embodiment of FIG. 1 is based on the assumption of scalable video coding that takes place in three layers. The individual layers correspond to data substreams of media data; layer 1 of said layers allows decoding of a video signal in a basic quality.

If the data of layer 2 is also available in addition to the data of layer 1, a video signal can be decoded whose resolution or quality is improved as compared to the first video signal. By analogy therewith, a third video signal that is improved as compared to the second video signal can be generated if the data all three substreams is available. The embodiment of FIG. 1 is based on the assumption, by way of example, that the data substream of layer 1 comprises a data rate of 160 kBit/s, that the data stream of layer 2 comprises a data rate of 200 kBit/s, and that the data stream of layer 3 also comprises a data rate of 200 kBit/s. It shall be pointed out that the layer 1 data, i.e. the substream of layer 1, is the most important. If only layer 1 data is received at a receiver, decoding of a video signal will be possible. The data of layers 2 and 3 enables improving said video signal, for example in terms of its resolution, i.e. it enables generating a larger image, or in terms of its quality, i.e. it enables generating a more intense depth of color or a higher resolution, for example.

FIG. 1 illustrates this by means of a first set of images 100 that may be generated using the data of layer 1 and that have a data rate of e.g. 160 kBit/s. FIG. 1 further shows the slightly larger images 110 that may be generated using the data of layers 1 and 2, i.e. having a total of 360 kBit/s. FIG. 1 further indicates that the images that may be generated on the basis of the data of layers 1 and 2 are larger or have improved quality as compared to those images that may be generated only on the basis of the data of layer 1. By analogy, FIG. 1 shows a set of images 120 that may be generated using the data of layers 1, 2 and 3, i.e. that are based on a data rate of 560 kBits/s. As compared to the set of images 110, the set of images 120, in turn, is improved in terms of size or resolution of the individual image, or in terms of the quality of the images.

By using scalable video coding such as H.264/SVC, for example, a media data stream may be subdivided into various substreams. Said layers may then be combined into different stages of quality. For example, if the highest layer fails, in the example of FIG. 1 this would be layer 3, the lower streams, i.e. layers 1 and 2, may be combined into a video having reduced quality.

The various layers of an SVC stream, i.e. media stream, may then be equipped with different modulation mechanisms, so that different parts of the signal may be decoded, depending on the channel quality. In other words, the more important layers, in the example of FIG. 1 this corresponds to layer 1, may be transmitted using a modulation alphabet that is more robust than a modulation alphabet used for a higher layer.

Embodiments of the present invention, therefore, comprise apparatuses for assigning transmission symbols to a media data stream of information symbols, the media data stream comprising a first substream for representing the media data in a basic quality, and the data stream comprising a second substream with additional data for representing the media data along with the first data stream with improved quality. The apparatus for assigning in this context comprises a first means for assigning first transmission symbols to the information symbols of the first substream, and a second means for assigning second transmission symbols to the information symbols of the second substream, the first transmission symbols being transmissible, as compared to the second transmission symbols, via a transmission channel having a lower error probability.

Embodiments are not limited to two substreams, but may generally comprise any number of, or N, substreams, two substreams having the above-mentioned properties, for example. Several embodiments will be contemplated below; specifically, an embodiment having three substreams will be contemplated by way of example of scaled video coding.

The media data may comprise scalable video data, but also scalable audio data. With regard to audio data, it would be feasible, for example, for a mono signal to be transmitted using a robust modulation alphabet, whereas additional information that enables stereo decoding or spatial audio decoding is transmitted using an accordingly additional modulation alphabet. Generally, any feasible media data may be used in this context. For example, photos, too, might be encoded in a basic quality using a first modulation alphabet, and additional information for decoding in an improved quality in a more error-prone modulation alphabet.

In embodiments, corresponding error protection mechanisms such as various channel coding concepts for the information symbols or transmission symbols of the substreams may also be employed.

Especially with regard to radio networks and mobile radio networks, scalability of media data is becoming increasingly important. Embodiments enable one-off encoding of the media content, it being possible to use the highest resolution or bit rate in this context. Versions of the media contents having lower quality may then be obtained by partial decoding. This is advantageous, in particular, for mobile receivers whose resources are limited; for example, mobile units often have limited computing power, energy supply, resolution of a screen, etc. In embodiments, the scalability of the media contents may be increased further in that the individual substreams are provided with different codings, i.e. in embodiments, individual substreams may have different redundancies added to them. Moreover, it is feasible in embodiments that individual substreams have different powers associated with them, so that rate or quality adaptation is made possible not only at the transmitter, but also at the receiver.

In one embodiment, the first means for assigning the first transmission symbols to the information symbols of the first substream may be adapted to assign the first transmission symbols from an m.ary modulation alphabet, and the second means for assigning second transmission symbols to the information symbols of the second substream may be adapted to assign the second transmission symbols from an n.ary modulation alphabet, wherein m≤n, and m, n are natural numbers.

In other embodiments, identical modulation alphabets may also be employed, i.e. m=n. Transmission with different error probabilities may then also be achieved, for example, via different transmit powers that are associated with the substreams, or the transmission symbols of the substreams. In other embodiments, spatial concepts such as associating the substreams with different spatial subchannels of an MIMO radio channel may also be employed in order to achieve the different error probabilities. Generally, embodiments may associate radio resources having different levels of robustness with the substreams, which radio resources having different levels of robustness will then result in the different error probabilities. In this context, radio resources may be understood to mean spatial channels, frequencies, time slots, codes, transmit power, modulation alphabets, redundancy, etc.

As was already mentioned above, the apparatus for assigning may be integrated in a radio or cable transmitter. In particular in cable networks there may be different propagation conditions. In cable networks, a quality of reception is often dependent on a distance of a transmitter from a receiver. In such an embodiment it would be feasible for receivers located at a larger distance to receive only a basic stream with an acceptable error rate, and for receivers located at a smaller distance to also receive the additional data with an acceptable error rate. Generally, the transmission conditions within cable networks are variable. For example, different expansion stages of subnetworks may provide different transmission bandwidths, so that not all of the receivers may support the full bandwidth. Accordingly, in embodiments, they may also be employed in wired transmitters and receivers, so-called cable transmitters and cable receivers.

For example, broadcast transmitters, or broadcasting stations, as are used for DVB are feasible, as are base stations of a mobile radio network, for example within the context of MBMS (mobile broadcast multicast services), or also fixedly installed servers or transmitters. In embodiments, the transmitter may be configured to transmit the first and second transmission symbols as broadcast transmission.

By analogy, embodiments of the present invention may also comprise apparatuses for estimating a media data stream on the basis of a stream of receive symbols, the apparatus for estimating comprising a demultiplexer for splitting the stream of receive symbols into at least one first symbol substream and a second symbol substream. The apparatus further comprises a first symbol estimator for associating a first substream of information symbols of the media data stream with the first symbol substream on the basis of a first symbol alphabet. In addition, the apparatus comprises a second symbol estimator for associating a second substream of information symbols of the media data stream with the second symbol substream on the basis of a second symbol alphabet.

The second symbol alphabet may comprise a large number of symbols than the first symbol alphabet. The first substream enables a media content to be represented in a basic quality, and the second substream together with the first substream enables the media content to be represented in an improved quality. In accordance with the above explanation, the first symbol alphabet may correspond to an m.ary modulation alphabet, and the second symbol alphabet may correspond to an n.ary modulation alphabet, wherein m≤n and m, n are natural numbers. In other embodiments, equally sized symbol alphabets, m=n, are also feasible.

Transmission with different levels of robustness or error probabilities may also be achieved, for example, by means of different transmit powers that are associated with the substreams, or the transmission symbols of the substreams. In such an embodiment, utilization of identical symbol alphabets would be feasible.

In other embodiments, spatial concepts, such as associating the substreams with different spatial subchannels of an MIMO radio channel, may also be employed in order to achieve the different error probabilities. In this case, too, utilization of identical symbol alphabets of the substreams would be feasible.

The apparatus for estimating may be integrated in a radio or cable receiver, it being possible for the receiver to be a mobile terminal, such as a mobile telephone or a PDA (personal digital assistant). Embodiments are not limited to mobile terminal devices; television sets, desktop computers, portable computers such as laptops or navigation systems are also feasible, for example.

Embodiments of the present invention will be explained in detail below with reference to a scalable video data stream. For example, in T. Schierl, T. Stockhammer, and T. Wiegand, "Mobile video transmission using scalable video coding", IEEE Trans. Circuits Syst. Video Technol., Vol. 17, No. 9, pp. 1204-1217, 2007, a three-layered scalable SVC method is presented, which by analogy with FIG. 1 comprises a first layer having 160 kBit/s, a second layer having 200 kBit/s, and a third layer also having 200 kBit/s. Layers 2 and 3 are adapted to provide additional data. In principle, however, embodiments are not limited to this specific video coding or these data rates.

In the following embodiment, various modulation alphabets are used for the substreams, i.e. layers 1 to 3. Generally, embodiments also offer the advantage that, for example in the event of decreasing channel quality, i.e. when transmission errors occur due to shadowing or other effects, for example, a smaller number of layers may indeed be decoded, but defective layers may be discarded. The remaining layers may then be decoded, and the media contents may be represented in reduced quality. Thus, embodiments enable adaptation to the transmission channel in receivers.

For the purpose of transmission via a transmission channel, for example known concepts such as OFDM (orthogonal frequency division multiplexing) may be used in cellular networks, such as in conventional terrestrial broadcast networks such as DVB-T, cf. ETSI EN 300 744 v1.5.1, "Digital video broadcasting (DVB); framing structure, channel coding and modulation for digital terrestrial television, "European Standard, 11 2004. In addition, cellular single-frequency networks SFN may be employed which enable reusing the same frequency in each cell, but are less flexible with regard to transmitting individual information, i.e. dedicated information, to individual subscribers, such as with personalized advertisements.

In embodiments, transmission concepts originating from mobile radiocommunication may be combined with broadcasting concepts. For example, higher spectral efficiency and improved coverage was achieved in the last few years in the field of mobile radiocommunication. For example, MIMO concepts (cf. I.E. Teletar, "Capacity of multi-antenna gaussian channels", European Transactions on Telecommunication, Vol. 10, No. 6, pp. 585-596, 1999), space-time coding (cf. B. Hassibi and B. M. Hochwald, "High-rate codes that are linear in space and time", IEEE Trans. Inf. Theory, Vol. 48, No. 7, pp. 1804-1824, 2002) and base station (BS) cooperation have also been referred to as macrodiversity in some contexts (cf. "S. Shamai and B. Zaidel, "Enhancing the cellular downlink capacity via co-processing at the transmitting end", Proc. IEEE VTC '01 Spring, Vol. 3, pp 1745-1749, 2001).

In V. Jungnickel, S. Jaeckel, L. Thiele, U. Krüger, A. Brylka and C. Helmolt, "Capacity measurements in a multicell MIMO system", (Proc. IEEE Globecom '06, 2006), measurement results are presented which indicate that additional gains in capacity may be achieved, in so-called rank-reduced LOS MIMO channels (LOS=line of sight), by using polarization multiplexing. As was already explained above, video coding has also been improved substantially.

Both concepts may use layered transmission, i.e. transmission in several layers. For example, MIMO systems may provide several layers in the space-time frequency domain to which, in embodiments, the individual substreams may be mapped. This approach is followed in the following embodiment with the layers of an SVC media data stream. Generally, it is to be noted that high-resolution video data may comprise high transmission rates, such as several Mbit/s, for example, but that broadband radio channels, which may be used for transmitting the high data rates, are unreliable. This disadvantage may be compensated for, in embodiments, by various technologies such as channel coding, spatial diversity, temporal diversity, frequency diversity, etc.

Figure 2:
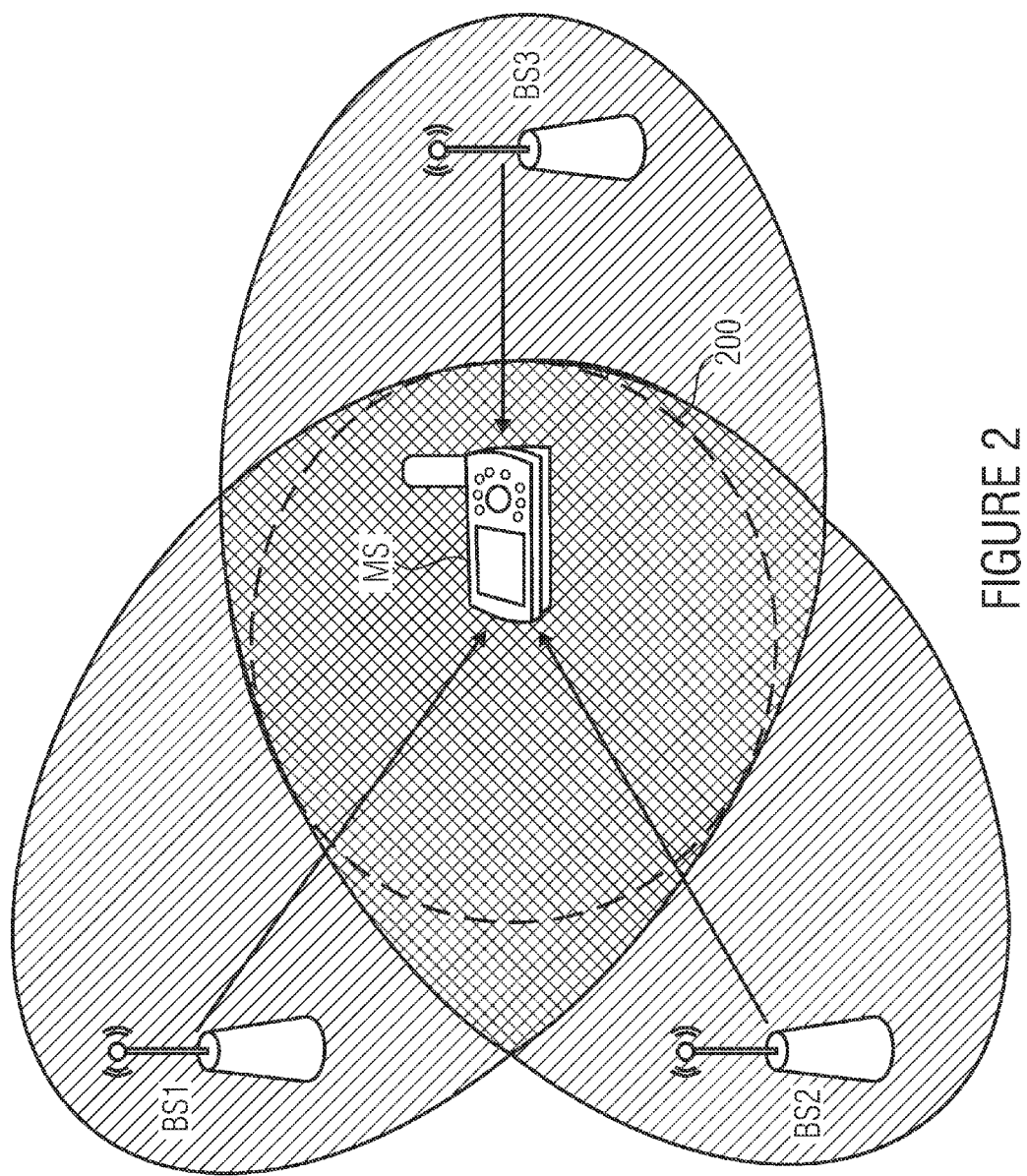
FIG. 2 shows an embodiment for illustrating a single-frequency network.

Some of these concepts will be explained below in more detail, embodiments not being generally limited to said concepts. In embodiments, so-called single-frequency networks may be employed. The concept of single-frequency networks is shown in FIG. 2 by way of example. FIG. 2 shows three base stations designated by "BS1", "BS2" and "BS3". FIG. 2 further shows a mobile station designated by "MS". All of the three base stations transmit the same signal within the single-frequency network. In a central region between the base stations, which is indicated by a dashed line 200 in FIG. 2, the signals of all of the base stations may be received. The mobile station is located within this area and thus contains three independent copies of the same signal, whereby a diversity gain is achievable. The signals of the three base stations may be considered as additional multipath components of the mobile radio channel.

In other words, in coherent single-frequency networks, several transmitters transmit the same signal via the same frequency. This enables a larger number of radio or television channels as compared to conventional multi-frequency networks, wherein the full bandwidth is not available for each transmitter. At the receiver, in the example of FIG. 2 at the mobile station MS, single-frequency transmission may be regarded as a multipath propagation. In particular in embodiments that use OFDM concepts, as long as the artificially generated multipath components lie within the protection interval, which is also referred to as guard interval or cyclic prefix, said multipath components increase the overall receiving power. On account of the independent paths, i.e. of the independent copies of the same transmit signal, diversity may be benefited from, in other words a higher order of diversity may be achieved.

Terrestrial digital TV (television) broadcast systems may utilize OFDM SFNs. Said systems may utilize frequency diversity since the bandwidth of the OFDM component exceeds the coherence bandwidth of the radio channel, and they are comparatively easy to implement since OFDM concepts are already known. Nevertheless, said systems do not take advantage of the gains that may be generated in the spatial plane. However, embodiments additionally also take advantage of spatial diversity, for example by means of the uncorrelated paths or signal copies sent out by several base stations, as was described by FIG. 2. Conventional concepts such as the DVB-T standard, for example, also provide no multi-antenna concepts such as spatial multiplexing and diversity coding concepts, for example. In accordance with the above explanation, single-frequency networks may be regarded as a particular form of multipath propagation.

Embodiments may further make use of polarization diversity. Polarization diversity offers another possibility of further improving the overall diversity gain. For example, two or more receive antennas may be employed, in embodiments, at receivers such as mobile radiocommunication terminals, for example. For example in V. Jungnickel, S. Jaeckel, L. Thiele, U. Krüger, A. Brylka, and C. Helmolt, "Capacity measurements in a multicell MIMO system," (Proc. IEEE Globecom, 06, 2006), measurement results are presented which indicate that at least two degrees of freedom exist in a rank-reduced LOS channel when cross-polarized antennas are used both at the transmitter and at the receiver. The diversity gain resulting therefrom is due to the fact that cross-polarized channels are uncorrelated to a certain degree. If the receiver is capable of separately receiving the signals of a horizontal and a vertical polarization plane, a corresponding gain may be achieved, for example, by means of maximum ratio combining (MRC), which enables coherent superposition of the signals of the polarization planes.

Figure 3:
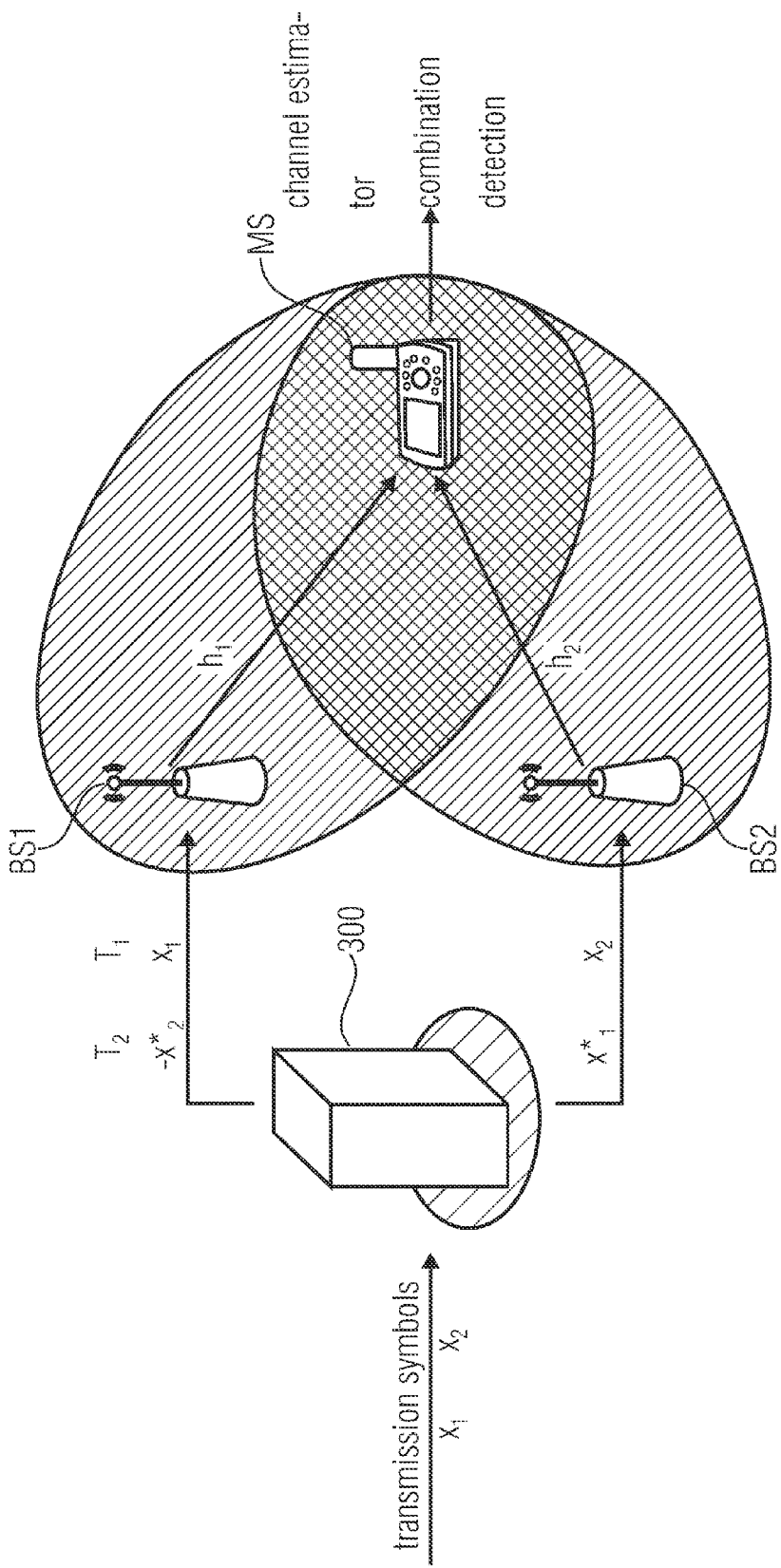
FIG. 3 shows an embodiment for illustrating space-time coding.

Embodiments may further make use of space-time coding (STC), as in the form of an Alamouti scheme, for example (cf. S. Alamouti, "A simple transmit diversity technique for wireless communications", IEEE J. Sel. Areas Commun, Vol. 16, No. 8, pp. 1451-1458, 1998). Time-space coding enables additional diversity gains at the receiver by means of the signals being interleaved in space and time at the transmitter; one also speaks of open loop transmit diversity. This concept is explained in more detail by FIG. 3. FIG. 3 shows two base stations indicated by "BS1 and "BS2". FIG. 3 further shows a mobile station designated by "MS". Additionally, two transmission symbols $x_1$ and $x_2$, which are successive in time, are supplied to a space-time coder 300.

The space-time coder 300 is connected to both base stations BS1 and BS2. During a first period of time, designated by $T_1$ in FIG. 3, the complex transmission symbol $x_1$ is sent by the base station BS1, and the complex transmission symbol $x_2$ is sent by the base station BS2. A transmission channel, which in FIG. 3 is modeled by $h_1$, is assumed between the base station BS1 and the mobile station. By analogy therewith, a transmission channel, which is modeled by $h_2$, is assumed between the base station BS2 and the mobile station MS. During a second period of time indicated by $T_2$ in FIG. 3, the negated conjugate-complex transmission symbol $-x^*_2$ is now transmitted from the base station BS1, and the conjugate-complex transmission symbol $x^*_1$ is transmitter from the base station BS2.

This scheme corresponds to the transmission scheme found by Alamouti which enables the receiver to initially estimate both transmission channels $h_1$ and $h_2$ and then to determine both $x_1$ and $x_2$ by combining the signals received during the time periods $T_1$ and $T_2$. The coding as defined by Alamouti also enables, by respectively adding and subtracting both superimposed signals from the time periods $T_1$ and $T_2$, constructively superimposing signal components of the same transmission symbol while at the same time destructively superimposing those of the other transmission symbol. This results in a diversity gain, since in the superimposed signal there are signal portions that have been transmitted via independent channels $h_1$ and $h_2$. This simple scheme allows coherent combination of both receive paths themselves when only a receive antenna is available at the mobile station MS. The corresponding combination of the signals may then be made available to a detector for detection.

In embodiments, a further concept, so-called polarization multiplexing, may be employed. This involves using cross-polarized antennas at the transmitter, i.e. at the base station. If the mobile station also used cross-polarized antennas, two data streams or data substreams may be multiplexed in the spatial plane. Each base station will then send a substream in the horizontal polarization plane and another substream in the vertical polarization plane. Due to multipath propagation, the polarization vectors may change their polarization direction during transmission via the mobile radiocommunication channel; however, this may be compensated for by corresponding channel estimation concepts along with MIMO equalization, whereby both substreams become separable at the receiver. In this context, for example neighboring base stations may send out the same signal in accordance with a single-frequency mode, but other concepts are also feasible, such as 6×2 time-space coding for joint transmission within a cell. Both concepts would be able to make use of frequency diversity and spatial diversity at the same time.

Figure 4:
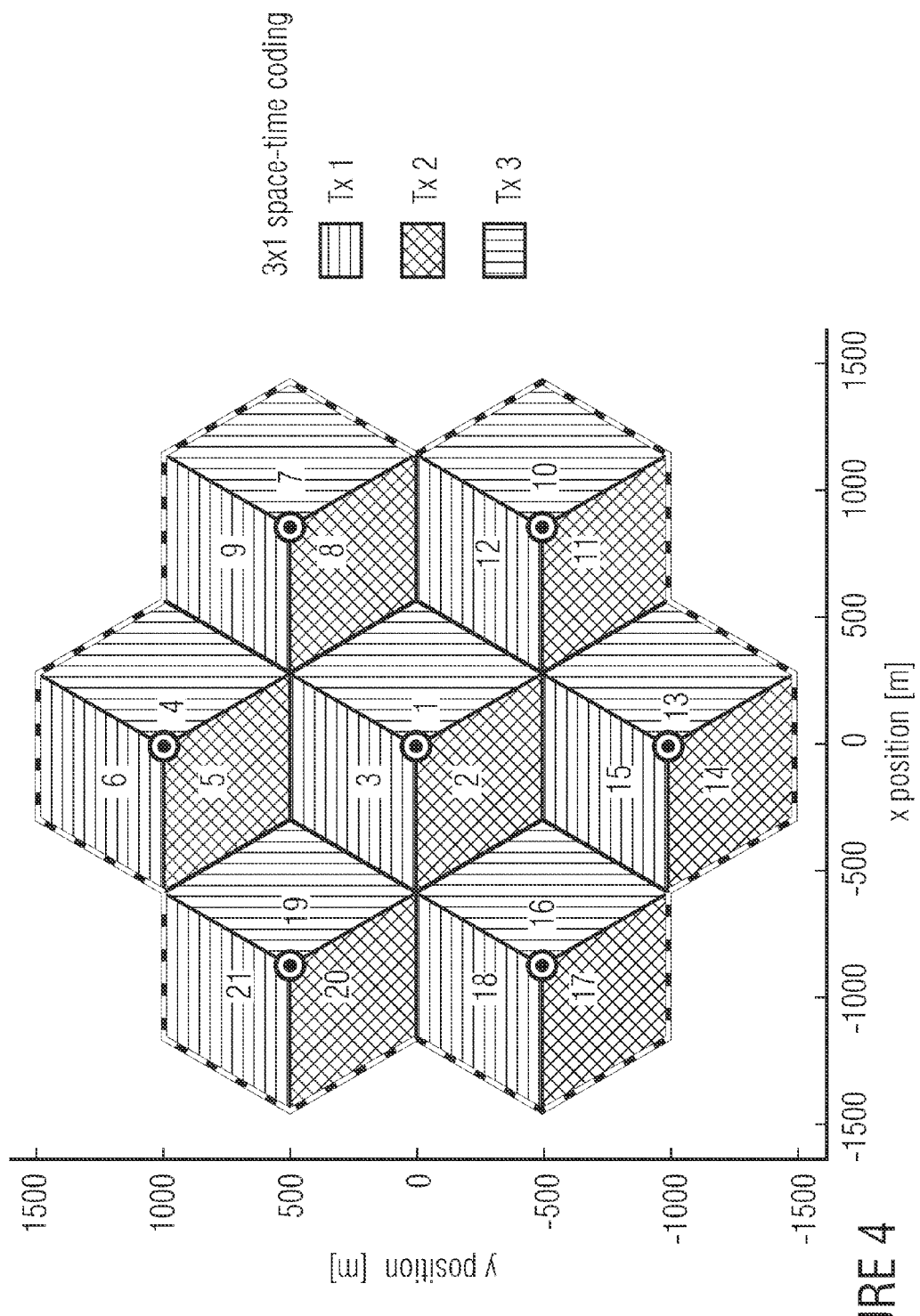
FIG. 4 shows an embodiment of a cellular network comprising space-time coding.

In embodiments, macrodiversity may be additionally benefited from, as will be explained in more detail below with reference to FIG. 4. To achieve a higher order of diversity, a 3×1 or a 6×1 space-time code may be implemented, for example, which extends across several neighboring base stations. FIG. 4 shows an arrangement of several base stations in a xy plane, the x position and the y position each being indicated in meters. FIG. 4 shows a hexagonal network structure based on the assumption of seven base station locations, each of which being located in the center of a hexagon. In addition, FIG. 4 is based on the assumption that each base station location has base stations located thereat, so that FIG. 4 contains a total of 21 base stations. The structure shown in FIG. 4 is also referred to as a cluster.

At this point, macrodiversity may be utilized, for example, by a 3×1 space-time code. This means that various time schemes, which in the embodiment shown in FIG. 4 extend across three time slots, are associated with individual base stations. FIG. 4 illustrates the associated code planning by cell areas shaded in different tones of gray. It may be seen that three different space-time codes coincide at the interfaces of the individual cell areas, respectively, so that a corresponding receiver may take advantage of the concepts already described above. For example, a mobile radiocommunication terminal may make use of knowledge of the individual channels—which may be determined as belonging to the individual base stations by means of channel estimation—in order to coherently combine the receiving powers of the independent channels. As was already described above, this provides an improved signal-to-noise ratio (SNR) and may thus also assist a network operator in utilizing higher-quality modulation alphabets such as 64 or 256 QAM (quadrature amplitude modulation), for example, for improving data throughput.

In embodiments, various transmission techniques may be employed. In one embodiment, DFT (discrete Fourier transform) spreading may be used, for example. Spreading methods offer a general possibility of improving the transmission properties of various bit streams. One known concept is the so-called CDMA (code division multiple access), which comprises multiplying a signal modulated at low rates by high-rate binary code sequences, the so-called spreading sequences. In this context, the transmission signal has a larger bandwidth than the information signal and therefore becomes more robust against transmission errors, in particular in multipath channels comprising fast fading.

The code sequences used may be orthogonal in pairs, and reconstruction of the information or input symbol stream will then become a simple process of multiplying the receive signal by the same code sequence, and an addition across a sequence length. Given the increasing amount of computing power available, non-binary spreading sequences may be used in real time in embodiments. Candidates for such spreading sequences may be derived, for example, from discrete Fourier transform, therefore the name DFT spreading. This may be effected, for example, by a unitary discrete Fourier transform of a data symbol vector $\vec{d}_m$, as is shown in equation 1 in FIG. 11, wherein $W_{n,m}$ are the scalar coefficients of the discrete Fourier spreading sequence with the components of equation 1.1 in FIG. 11.

In the equations, $N_{dft}$ corresponds to the number of input symbols of the discrete Fourier transform, the power scaling factor $1/\sqrt{N}$ serves to limit the power of the OFDM system. The lengths of the vector of data symbols $\vec{d}_m$ and $\vec{x}_n$ are equal to the number of parallel transmission streams in the spatial plane, e.g. to the number of transmit antennas in a MIMO multiplexing system. Following transmission through a MIMO OFDM radio channel, each of the N transmission symbols has undergone frequency-selective fading, which may be expressed, in accordance with equation 2 of FIG. 11, e.g. by the (narrowband) MIMO transmission equation for each of the OFDM sub-carriers (I.E. Telatar, "Capacity of multi-antenna gaussian channels", European Transactions on Telecommunications, Vol. 10, No. 6t, pp. 585-596, 1999).

In equation 2 of FIG. 11, $\vec{y}_n$ corresponds to the receive symbol vector $H_n = n_{Tx} \times n_{Rx}$ of the channel matrix in terms of the dimensions of the number of transmit antennas $n_{Tx}$ and of the number of receive antennas $n_{Rx}$, and $\vec{v}_n$ is additive noise. Equalization may take place in accordance with the minimum mean square error (MMSE) concept (cf. A. van Zelst, "Space division multiplexing algorithms", Proc. IEEE MeleCon, 00, Vol. 3, pp. 1218-1221, 2000), and DFT despreading will then lead to an estimated data symbol in the receiver in accordance with equation 3 in FIG. 11. In equation 3, FIG. 11, $W^*_{n,m}$ corresponds to the complex conjugate of $W_{n,m}$. It can be proven that equalization in the frequency range, followed by inverse discrete Fourier transform despreading, provides the same quality as a RAKE multiuser detector that is based on a DFT spreading sequence, cf. S. Jaeckel and V. Jungnickel, "On the optimality of frequency-domain equalization in DFT-spread MIMO-OFDM systems", Proc. IEEE WCNC, '08, 2008. At least theoretically, the maximally achievable diversity gain may thus be obtained by coherently combining the powers of several multipath components. This may be advantageous, in particular, in such embodiments which also use SFN transmission in a broadcast network so as to increase the number of multipath components.

Figure 5:
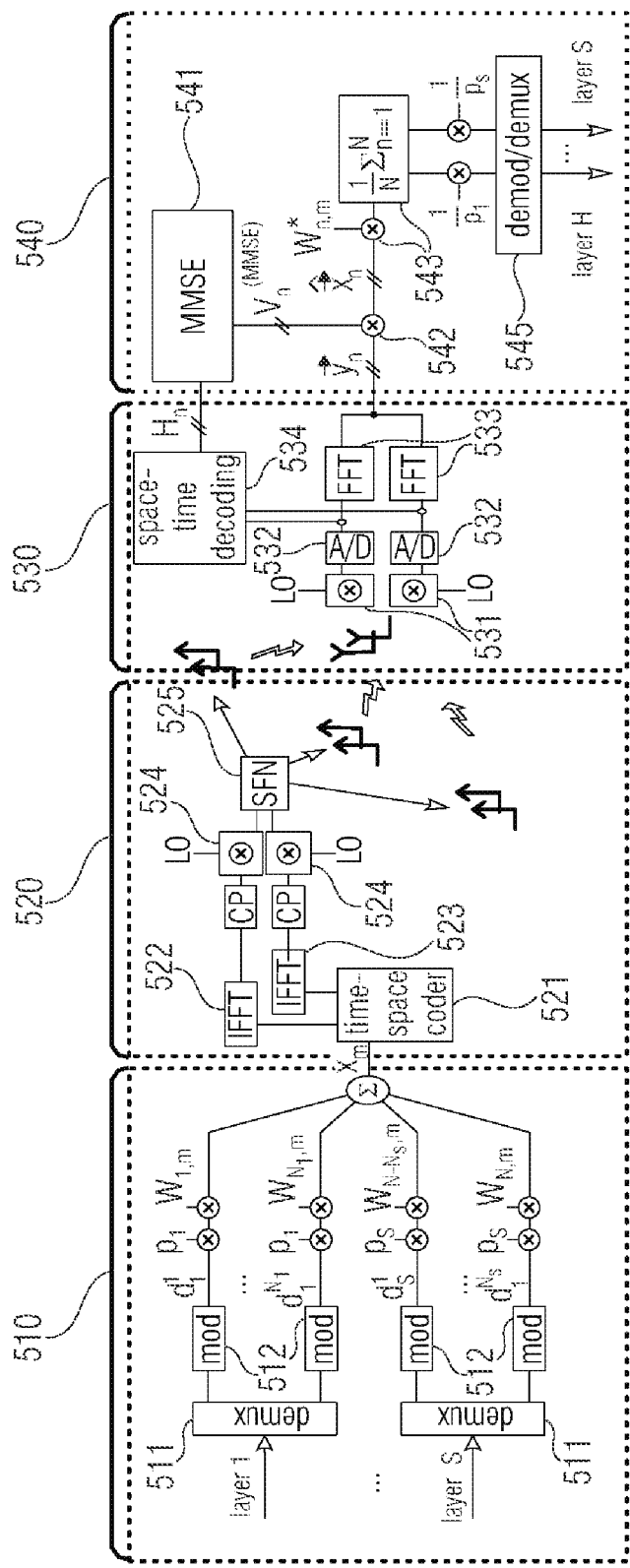
FIG. 5 shows an embodiments of a signal processing chain.

FIG. 5 shows a block diagram of an embodiment of a signal transmission chain. In a first block 510, single carrier-frequency division multiplexing (SC-FDM) is performed. In the data processing block 510, the data streams of the substreams of the media data initially arrive as seen from the left-hand side. By way of example, FIG. 5 is based on the assumption of S layers. Initially, the symbols of the individual layers are demultiplexed, which is effected in blocks 511. In other words, serial-to-parallel conversion is performed here on the information symbols of the individual layers. Subsequently, modulation or transmission symbols are assigned, which takes place in blocks 512. The data symbols $d_n$ resulting therefrom are weighted by power factors $p_n$ are then transformed to the frequency range by using the DFT spreading sequences $W_{n,m}$ already described, and are added.

In FIG. 5, block 520 shows a time-space coder 521, which codes the output signal of the block 510 accordingly. In each of the two transmit branches, the space-time coder has the following connected downstream from it: an IFFT 522, a block 523 for inserting the guard interval (CP, cyclic prefix), one local oscillator 524, respectively, for mixing the baseband signal into the transmission band, followed by a single-frequency network SFN 525. Blocks 510 and 520 thus result in the signal-processing chain in a transmitter.

FIG. 5 further shows two signal-processing blocks 530 and 540, which may be implemented together in one receiver. In block 530, a receive signal is received via two transmit antennas, for example. Each receive branch has a local oscillator 531 arranged therein which is followed by an analog-to-digital converter 532. The analog-to-digital converter has two FFTs 533 connected downstream from it, which transform the discrete baseband signal to the frequency range. In parallel with the FFTs 533, a channel estimation or space-time decoding is effected in block 534, the estimated channel $H_n$ and the frequency range receive signal $y_n$ being transferred to block 540. In block 540, a frequency range equalization initially takes place, which is performed by a corresponding MMSE weighting calculation 541 with subsequent multiplication to the receive signal 542. Subsequently, DFT despreading may be performed by an inverse DFT 543, whereby, in turn, the stream of symbols is parallelized and subdivided into the individual substreams, which are associated with the individual layers and are still power-scaled, for example. This may be followed by power descaling 544, whereupon the information symbols of the individual substreams may be estimated and demultiplexed in a block 545.

Embodiments may use so-called one-carrier multiplexing or single-frequency multiplexing. In mobile radio systems such as the 3GLTE ($3^{rd}$ generation long term evolution), both individual subscriber data and broadcasting data is transmitted at the same time. Both types of data may use the same frequency range, for example by means of TDMA (time division multiple access). The duration of an individual time slot may be selected such that the broadcasting traffic to be sent, for example of the number of programs ready to be used or of the point-to-point connections, is taken into account. During a time slot, the broadcast system has full channel access and may thus use the above-described diversity concepts, for example also specific pilot tones or symbols, space-time coding and channel coding, upgraded guard intervals, modulation schemes, etc.

Thus, SC-FDM may be used for multiplexing several layers of a video data stream into one single carrier, cf. also V. Jungnickel, T. Hindelnag, T. Haustein and W. Zirwas, "SC-FDMA waveform design, performance, power dynamics and evolution to MIMO", Proc. IEEE Portable, 07, 2007.

FIG. 5 shows a general SC-FDM transmission or signal-processing chain. As was already explained above, the individual layers of the scalable video data are assigned to separate modulation or transmission symbols, it also being possible to use different channel coding concepts for the individual layers. In other words, embodiments of transmitters or radio transmitters may have channel coders configured to add different redundancies to the first or second substreams. By analogy, a receiver, a radio receiver or a cable receiver may comprise, in accordance with an embodiment, a channel decoder configured to take into account different orders of magnitude of redundancy for decoding the substreams.

In addition, embodiments of transmitters or radio transmitters may have a power control in order to associate different transmit powers with the transmission symbols of the first and second substreams. In one embodiment, power scaling may be applied such that layers having a higher modulation degree, i.e. a larger modulation alphabet (QAM) are given less power at the same time. Embodiments thus improve the dynamics of the different channel codings of the substreams and may further improve overall dynamics of the signal, also referred to as peak-to-average power ratio (PAPR), in the composite one-carrier signal, the dynamics being decisively influenced by the modulation alphabets of the higher orders, such as 16 or 64 QAM.

As was already mentioned, unequal error coding, also referred to as unequal error protection, may also be used in embodiments. In one embodiment, hierarchical coding concepts may be employed, such as in SVC, wherein it is possible to decode layer 2 only if layer 1 was decoded correctly; by analogy, layer 3 may be decoded only if layers 1 and 2 have already been correctly decoded. Even though it is generally difficult to adapt, within a broadcast system, the transmission concepts to the channel, embodiments may comprise adaptation to the source. By associating several radio resources, for example by using a larger bandwidth, QPSK (quadrature phase shift keying) instead of 16 QAM modulation, etc., the transmission quality of, e.g., layer 1 may be decisively influenced. However, the transmission quality of a higher layer may decrease accordingly. The following conditions may be used for calculating the modulation and coding parameters.

Initially, the overall number of resources available is important. For example, when N radio resources, e.g. inputs of the DFT encoder, are available, N-complex modulation symbols may also be generated. The number of resources available on each layer is then limited, as is indicated in accordance with equation 5 in FIG. 11, wherein S corresponds to the number of layers, and $N_s$ equals the number of one of the resources associated with a layer s.

A further factor may be the incoming SVC data rate per substream. Each SVC substream has a specific number of bits that are processed during a predefined transmission interval, also referred to as TTI (transmission time interval). The modulation format, e.g. BPSK (binary phase shift keying), QPSK, 16 QAM, etc. and the number of assigned radio resources is associated accordingly. Additionally, redundancy may be added to the individual substreams within the context of a forward error correction (FEC), specifically within the context of various coding specifications. To this end, corresponding minimum numbers of bits per transmission packet, also referred to as packet data unit (PDU), may be considered.

A further factor may be the difference in the desired bit error rates (BER) between the respective substreams. In embodiments, two SVC layers may achieve different bit error rates. Thus, different signal-to-noise ratios, or a signal-to-noise ratio offset between the individual substreams may be connected due to the different modulation formats. For example, 16 QAM may achieve a lower transmission quality than QPSK, for example. However, what is to be considered in this context is also the transmit power $P_s$, which is associated with the individual substreams and will be addressed below.

In addition, it is advantageous to take into account the power constraint of the OFDM system. The transmit power in mobile radio systems is generally constrained. When considering scaling factors of the power scaling of the individual substreams, the overall power should not exceed a certain limit. This is illustrated in equation 5 in FIG. 11, wherein $n_{Tx}$ is the number of transmit antennas, $N_s$ is the number of data streams, and $P_{Tx}$ corresponds to the overall transmit power.

A further factor is the ratio of peak power and average power, which is also referred to as PAPR and refers to the time domain signal of the OFDM transmission system. Inverse fast Fourier transform (IFFT) generates a discrete time signal having NT samples and is indicated in equation 6 of FIG. 11. N designates the number of carriers of the OFDM system, and T indicates the oversampling factor for determining the PAPR, cf. also S. H. Han and J. H. Lee, "An overview of peak-to-average power ratio reduction techniques for multi-carrier transmission", IEEE Wireless Commun, Vol. 12, No. 2, S. 56-65, 2005.

In embodiments, two parameters may be calculated for each of the S layers, namely the modulation format and the power scaling coefficient. If all of the possible combinations of the S layers and M modulation formats are compared, one will obtain an asymptotic complexity of $O(M^S)$. In the embodiment contemplated, the three layers have 160, 200 and 200 kBit/s.

For simplicity's sake it shall be assumed in the following that in the embodiment, 560 bits, i.e. 160 for layer 1 and 200 for layers 2 and 3, respectively, are transmitted in a TTI in a 256 carrier system. A signal-to-noise distance difference of 8 dB is to be guaranteed between the individual layers so as to level out the dynamics of the channel and power scaling factors and to thus keep the PAPR small. In addition, four modulation alphabets will be taken into account in the following, namely BPSK, QPSK, 16 QAM and 64 QAM. In an uncoded OFDM system, QPSK may use a signal-to-noise ratio that is improved by about 3 dB as compared to a BPSK system in order to be decoded with the same bit error rate. 16 QAM may use about 6 dB, and 64 QAM may use about 5.2 dB as compared to BPSK. A comparison of said $4^3=64$ combinations yields, for this embodiment, that BPSK may be well applicable in layer 1, 16 QAM in layer 2 and 64 QAM in layer 3. To achieve the desired difference of 8 dB, resulting power scaling factors are 1 for layer 1, 1.25 for layer 2, and 0.66 for layer 3.

Figure 6:
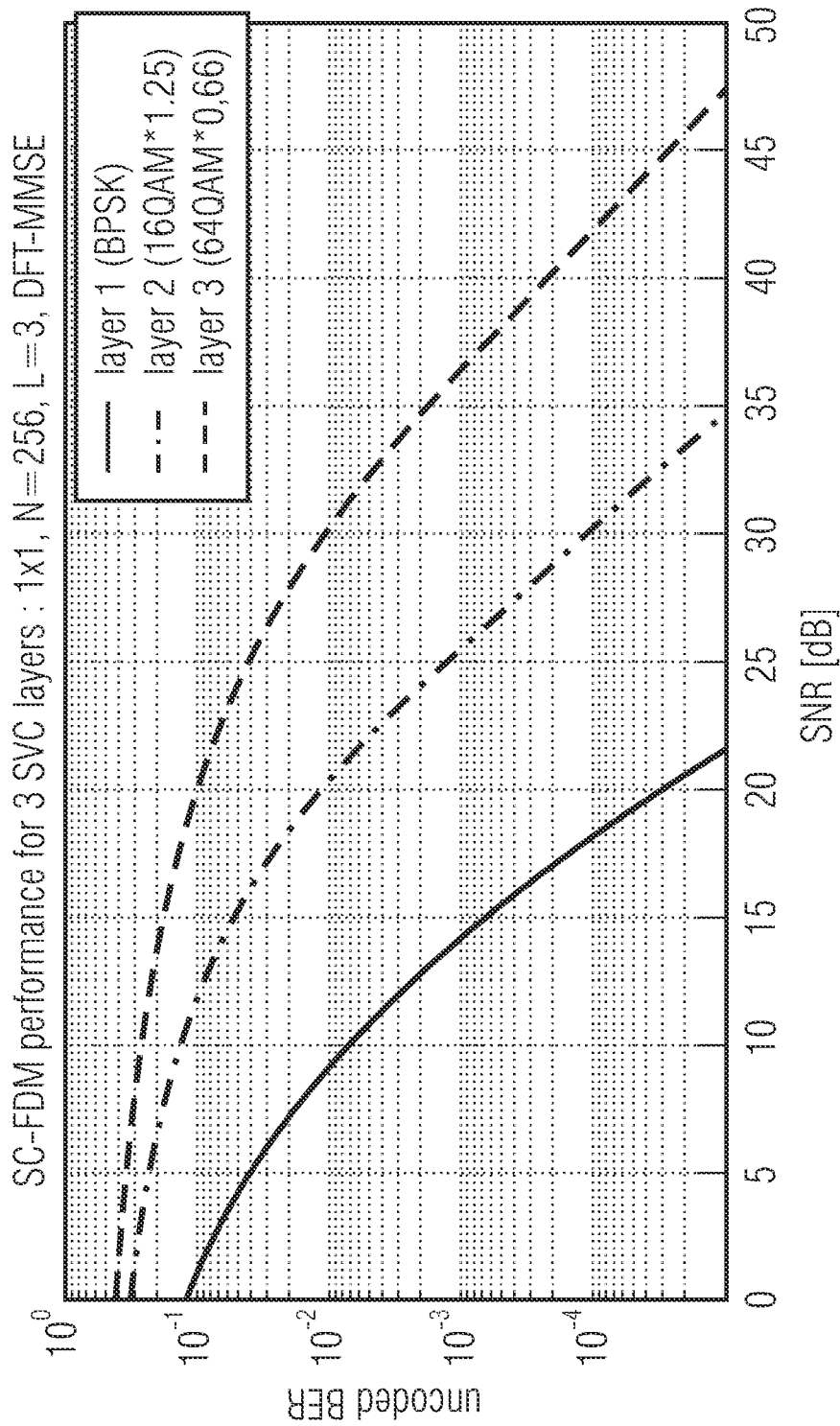
FIG. 6 shows simulation results based on an embodiment.
Figure 7:
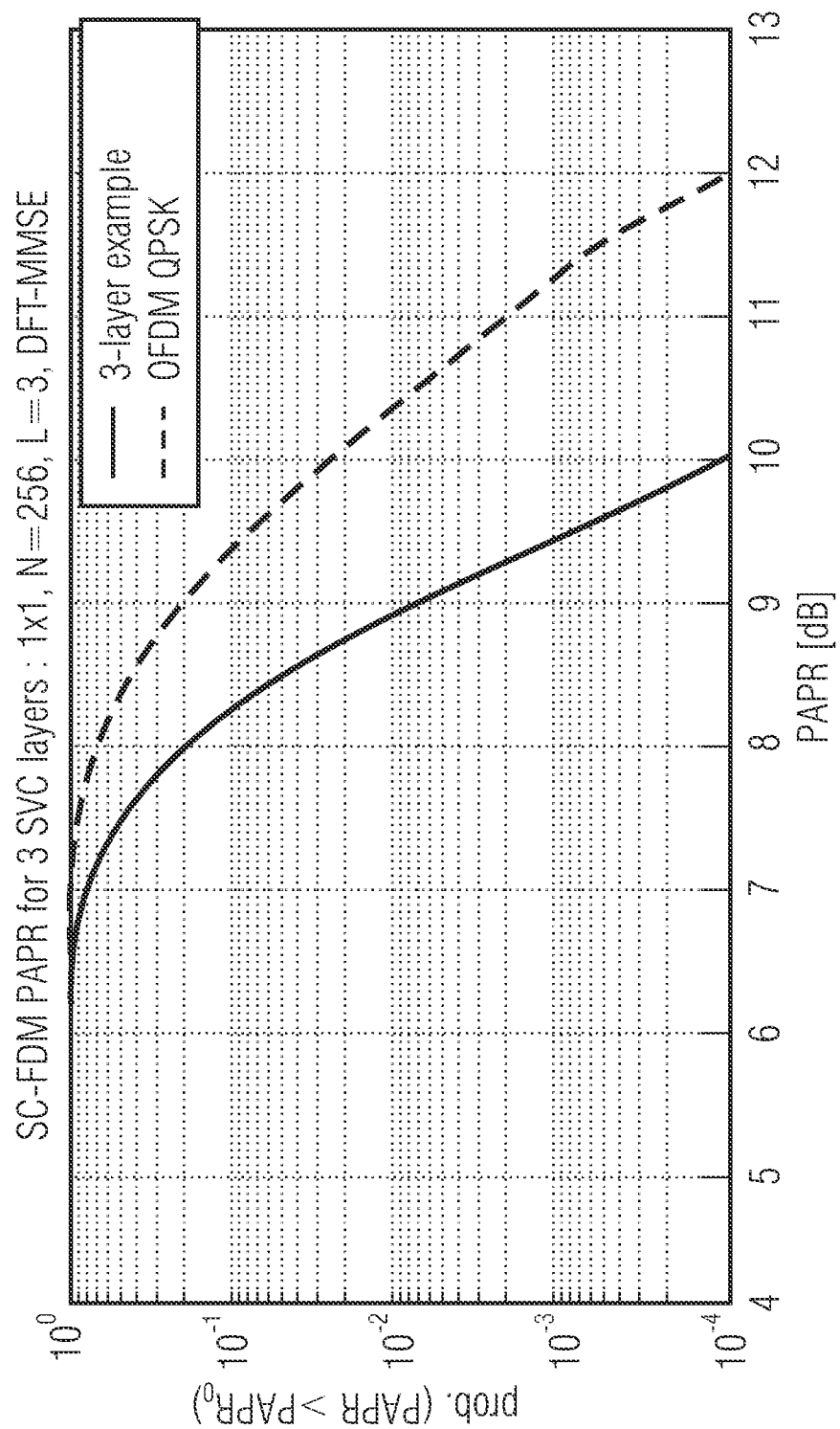
FIG. 7 shows further simulation results based on an embodiment.

FIG. 6 shows simulation results for the above-contemplated embodiment in a Rayleigh radio channel having L=3 independent fading channels. In particular, the uncoded bit error rate is plotted over the signal-to-noise ratio. The bit error rate of layer 1 is indicated by a continuous line, the bit error rate of layer 2 is indicated by a dash-dotted line, and the bit error rate of layer 3 is indicated by a broken line. During transmission, DFT spreading and frequency range equalization (MMSE) were performed. With an uncoded bit error rate of $2 \times 10^{-4}$ one may recognize that the three curves of the two layers have a difference of about 12.2 dB between layer 1 and layer 2, on the one hand, and of 11.5 dB between layer 2 and layer 3, on the other hand. In other words, about 25 dB of the SNR range are covered by the concepts described and by the coding. Therefore, the video data stream could not break off due to a sudden degradation of the signal strength; it could only reduce its quality. The additional difference is also caused by the DFT spreading, which also makes use of the multipath diversity since the substreams are spread to a bandwidth larger than the coherence bandwidth of the mobile radio channel. In addition, the connection with the RAKE receiver was already pointed out above. Moreover, the PAPR is reduced by the one-carrier transmission. This is depicted in FIG. 7. FIG. 7 shows a complementary cumulative distribution function (CCDF) of the PAPR for the three-layer embodiment contemplated, indicated by a continuous line, and for an uncoded 256 carrier OFDM system comprising QPSK modulation, indicated by a broken line. As was already set forth in S. H. Han and J. H. Lee, "An overview of peak-to-average power ration reduction techniques for multicarrier transmission", IEEE Wireless Commun, Vol. 12, No. 2, S. 56-65, 2005, an oversampling factor of T=4 was selected for calculating the corresponding values. The 0.1% PAPR limit of SVC is at about 9.5 dB, whereas the OFDM QPSK reference is at about 11.3 dB. Thus, the embodiment proposed not only makes use of the advantages of multipath diversity, but also achieves improved PAPR distribution on account of the SC FDM concept used.

System level simulation results will be set forth in the following. To obtain realistic subscriber channels in a multi-cell multiple-access scenario, system-level simulations were performed on the basis of the 3GPP (third generation partnership project) space channel model (cf. 3GPP TR 25.996 v7.0.0, "Spatial channel model for multiple input multiple output (MIMO) simulations", Tech. Rep. 6, 2007). In addition to the original version, various upgrades, such as the support for polarized antennas (cf. L. Jiang, L. Thiele, and V. Jungnickel, "On the modelling of polarized MIMO Channel", Proc. European Wireless Conference, 07, 2007), antenna tilt and mixed scenarios (cf. L. Thiele, M. Schellmann, W. Zirwas, and V. Jungnickel, "Capacity scaling of multiuser MIMO with limited feedback in a multicell environment", Proc. Asilomar, 07, 2007) were taken into account in order to obtain realistic statistics.

As a channel model, the SCME-C (SCM=spatial channel model, E-C=urban macrocellular scenario) with a center frequency of 2 GHz was contemplated. The bandwidth is 30.72 MHz with a number of 512 sub-carriers and 7 base station locations; 3 sectors were provided from each base station location. The base station altitude was assumed to be 32 m, and the mobile station altitude was assumed to be 2 m. In addition, the base stations were assumed to be located at a mutual distance of 1000 m, and antennas having an antenna gain of 14 dBi were assumed to be present in a cross-polarized form. The tilt angle of the antennas was assumed to be 3.7°, and a maximum transmit power of 30 dBm was assumed for each base station. In addition, an input sensitivity of the receiver of −95 dBm was assumed.

Figure 8:
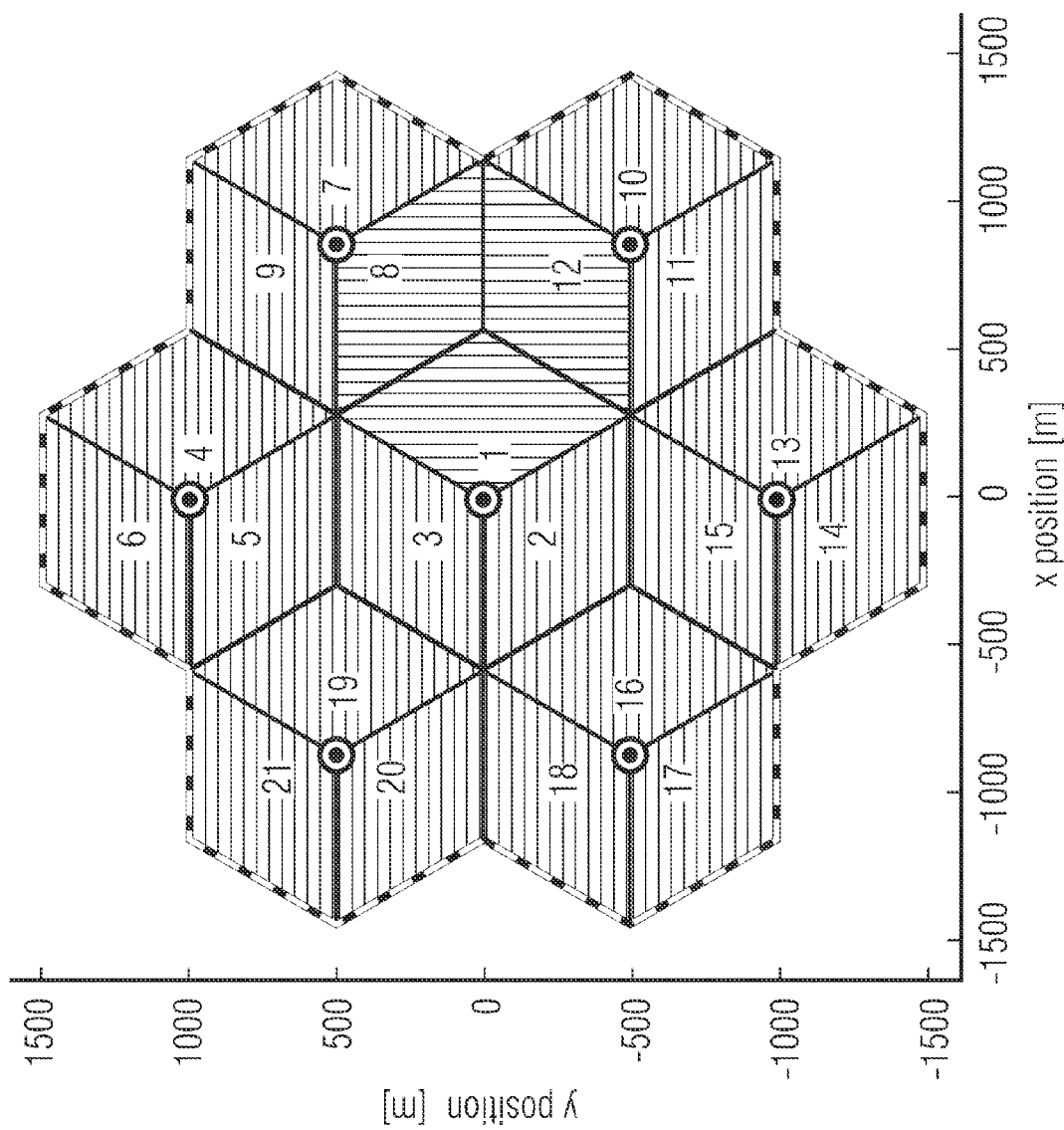
FIG. 8 shows an embodiment of an arrangement of base stations.

The SCME simulation environment provides that 10,000 subscribers are randomly placed between the three base stations shown in FIG. 8. FIG. 8 shows a cellular network scenario as was already explained with reference to FIG. 4. The dark-shaded areas in FIG. 8 indicate that area of the network wherein the subscriber channels were evaluated. It shall further be assumed that a 2×2 polarized channel realization H is calculated for each subscriber. The SCM channel coefficients may then be used for calculating a bit error rate simulation for the three-layer SVC embodiment. By way of example, the simulated transmission chain uses 512 OFDM carriers. 320 resources are associated with layer 1 with BPSK modulation. Layer 2 has 100 resources with 16 QAM and a power scaling factor of 1.25. Layer 3 has 68 resources with a multiplier of 0.66. Channel H is assumed to be constant over a time period of 50 implementations, the superimposed noise changing from implementation to implementation.

A power of −95 dBm was assumed for the background noise, and the overall transmit power of a base station is 30 dBm. The comparatively low power ensures that none of the transmission concepts contemplated achieves 100% coverage so as to enable fair comparison of the results. In total, 66,000 random bits are transmitted. For said bits, the bit error rates are evaluated for all SVC layers. If a bit error rate of less than $2 \times 10^{-4}$ is achieved, it will be assumed that the respective layer is free from errors. No additional channel code is used in the simulations contemplated.

Figure 9:
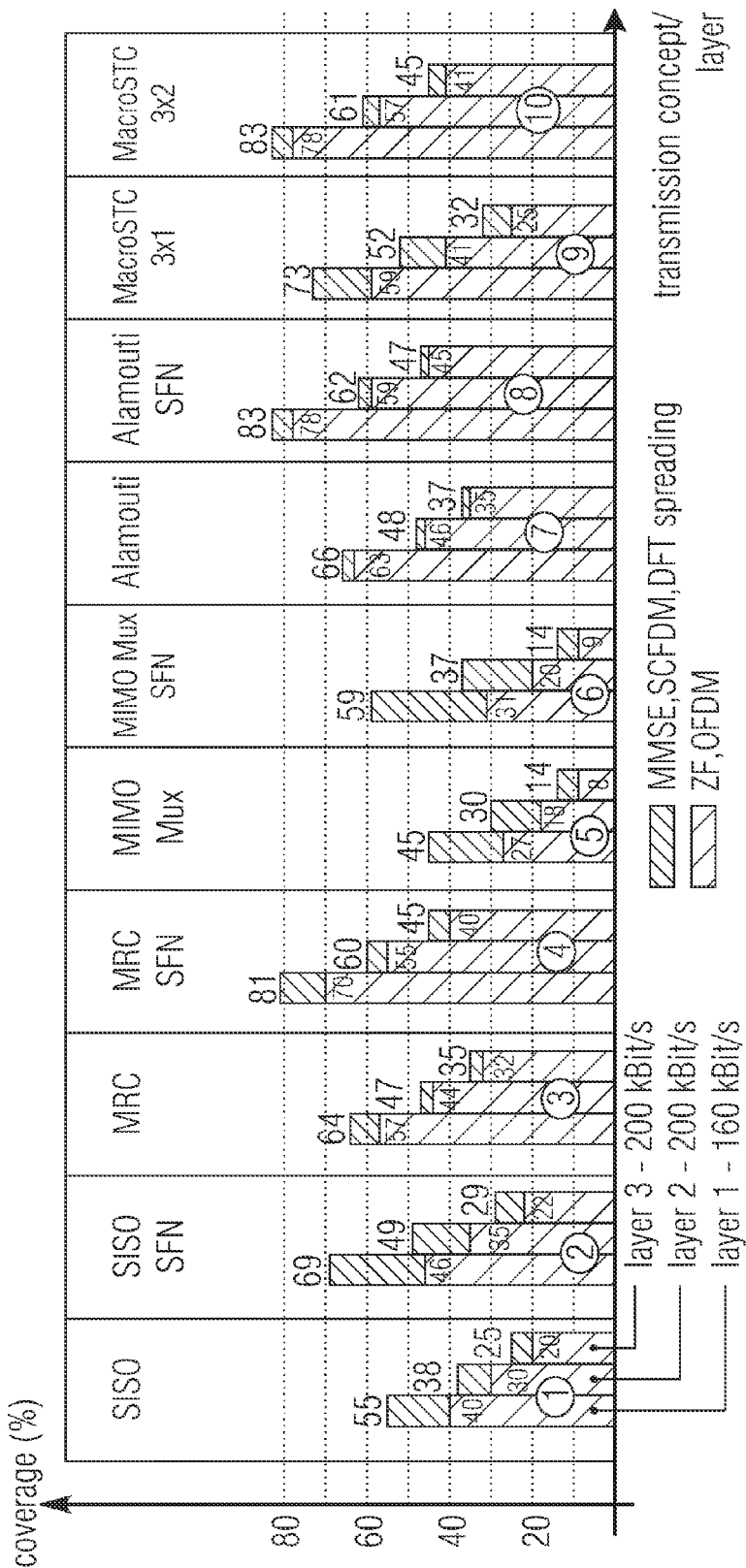
FIG. 9 shows simulation results with different embodiments.

FIG. 9 illustrates the simulation results produced. In FIG. 9, various transmission concepts for the individual layers are plotted on the x axis in the form of bar charts, the height of the individual bars indicating the relative coverage in percent. In each bar chart, a light gray portion indicates the coverage for MMSE, SCFDM with DFT spreading, and the dark area indicates a reference system ZF, OFDM (ZF=zero forcing). As transmission concepts, SISO (single input single output), i.e. a system having a transmit and a receive antenna, SISO SFN, MRC, MRC-SFN, MIMO Mux, MIMO Mux SFN, Alamouti, Alamouti SFN, Macro STC 3×1 and Macro STC 3×2 were contemplated.

One may conclude, from the compared transmission systems, that MMSE-DFT-SCFDM will outperform ZF-OFDM. However, said gains decrease as spatial diversity increases, as has been revealed, for example, by the cases MRC, Alamouti, Alamouti SFN and Macro STC 3×2. For clarity's sake, the transmission concepts contemplated have been given consecutive numbers from the left to the right in FIG. 9. Reduction of the gains is due to the fact that ZF-OFDM is not able to make use of frequency diversity. If the antenna diversity or the spatial diversity (MRC or STC) is utilized, the corresponding coverage for ZF-OFDM will also increase.

One may further see from FIG. 9 that SFN transmission increases coverage for all of the transmission concepts. In the event of SFN, the receiving power at the cell edge may be increased by combining the additional echoes. DFT-MMSE frequency range equalization is capable of constructively superimposing said echoes, whereas ZF-OFDM merely makes use of the gain of a field, but not of the diversity gain. One may further see from FIG. 9 that the macrodiversity concepts contemplated do not achieve any substantial gains. In cases 9 and 10, an orthogonal 3×1 STC was used (cf. B. Hassibi and B. M. Hochwald, "High-rate codes that are linear in space and time", IEEE Trans. Inf. Theory, Vol. 48, No. 7, S. 1804-1824, 2002). In the second case, SISO-SFN and, in the ninth case, 3×1 STC, the same antenna constellations, i.e. three transmit antennas at the three transmitters and one receive antenna at the receiver, were used. The difference is that in case 9, diversity in the spatial plane is utilized, whereas in case 2, the additional transmit signals in the frequency range are correlated, whereby frequency diversity is utilized.

Cases 10, 3×2 STC, and 4, SIMO-SFN-MRC, also have the same antenna constellation of three transmit antennas at three base stations, respectively, and two receive antennas at the mobile station. The macrodiversity concept provides a larger range of transmission than the SFN scheme for ZF-OFDM systems only. This results from the fact that ZF does not make use of frequency diversity. However, if frequency diversity is made use of by means of DFT spreading and MMSE equalization, the gain achievable by macrodiversity lies only in a range from 1-4%. If one also considers that e.g. a 3×1 STC achieves only ¾ of the data rate and that there is no orthogonal full-rate STC for more than two antennas, it would appear that macrodiversity does not achieve gains in all of the cases.

According to the simulation results, two embodiments are particularly suitable for broadcast systems. In one embodiment, Alamouti STC with SFN transmission is used with two transmit antennas per base station and two receive antennas at the receive station. Even with the reduced transmit power of only 1 Watt, this configuration achieves the best coverage. 83% of subscribers can decode the layer 1 data, and 47% of all subscribers can decode all three substreams or layers. If the system switches to a MIMO multiplexing concept with SFN (case 6 in FIG. 9), it will be possible to transmit two substreams simultaneously. This increases the data rate by a factor of 2, but is associated with substantial losses in the range of transmission.

With a transmit power of 46 dBm, 40 W, transmission ranges may be achieved wherein 99.8% of subscribers can receive the layer 1 data, 95% of subscribers can receive the layer 1 and layer 2 data, and 79% of all subscribers can receive the data of all three layers if one resorts to the Alamouti concept with SFN. At the same transmit configuration with spatial multiplexing, 94% can receive the data of layer 1, 68% can receive the data of layers 1 and 2, and 49% can receive the data of layers 1 to 3. It is to be expected that said values will improve further as the distance between the base stations decreases. Therefore, the embodiment comprising MIMO multiplexing appears to be an option for relatively small cells, for example in indoor applications.

Figure 10:
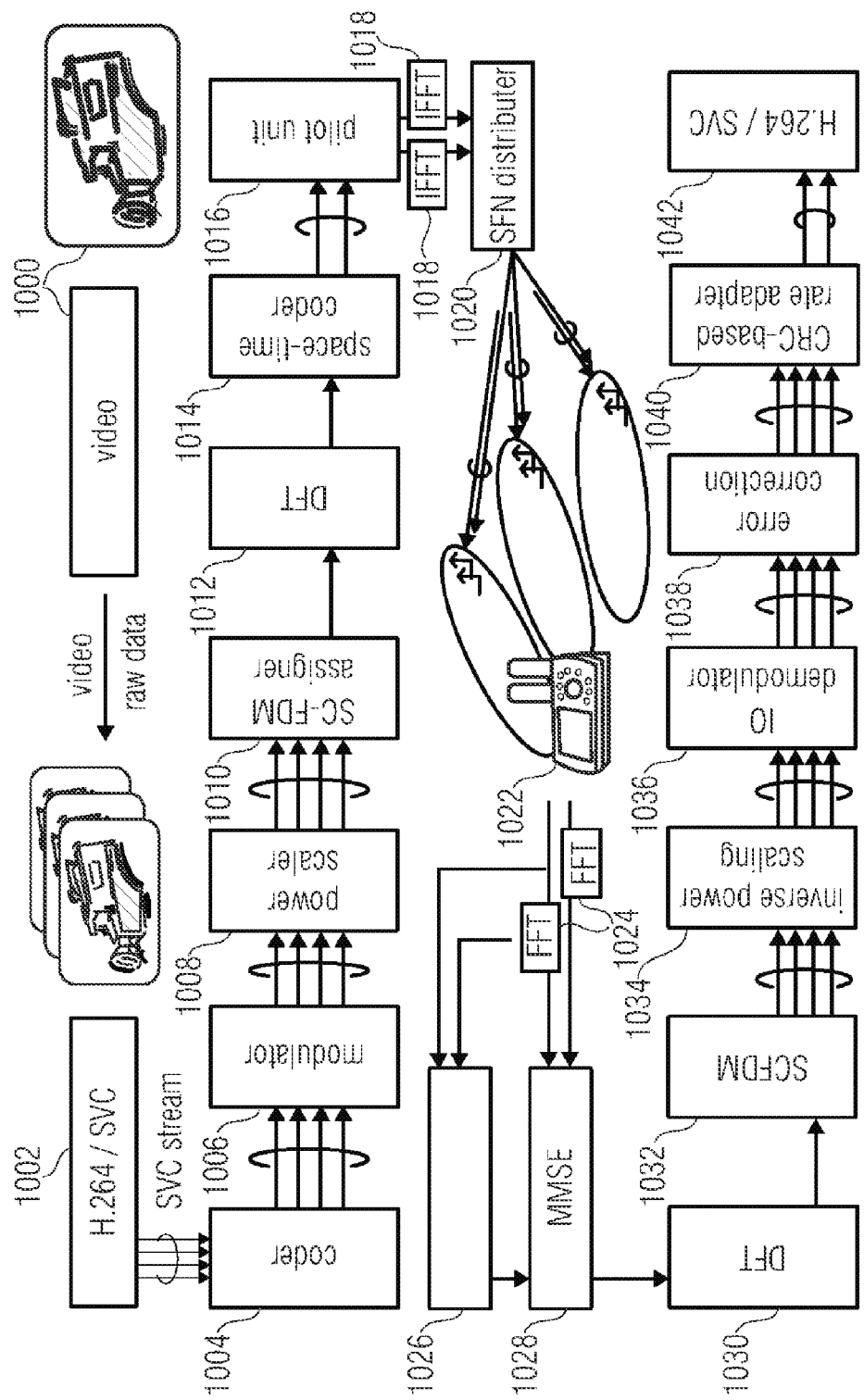
FIG. 10 shows a block diagram of a signal processing chain in an embodiment of a transmission system.

In the following, embodiments shall be explained once again by means of FIG. 10 which depicts an overview block diagram of a system concept. FIG. 10 shows a signal-processing chain of an entire transmission system composed of a transmitter and a receiver, the components of the transmitter being depicted in the upper half of FIG. 10, and the components of the receiver in the lower half. The embodiment described below comprises a combination of DFT spreading, space-time coding and single-carrier transmission in order to obtain additional diversity gains as compared to conventional broadcast systems.

In other words, embodiments may comprise frequency spreading, or a frequency spreader, in order to superimpose transmission symbols of the first and second substreams within a frequency range. In addition, embodiments may comprise a space-time coder for coding the superimposed transmission symbols. Moreover, in embodiments, an OFDM transmitter may be used for transmitting the superimposed transmission symbols via a radio channel as the transmission channel. In embodiments, the OFDM transmitter may comprise a number of sub-carriers that differ from the dimension of the frequency spreader. For example, it is feasible in embodiments to select the bandwidth of the OFDM transmitter to be broader than the bandwidth of the output signal of the frequency spreader. In such embodiments, there are several possibilities of how the output signal of the frequency spreader may be mapped to the sub-carriers of the OFDM transmitter. For example, mapping may be effected in a block-wise manner, wherein the output signal may be assigned unchanged to a block of sub-carriers of the OFDM transmitter, which may be located at the upper or lower end of the OFDM frequency range, but may also be associated with a medium range. In other embodiments, comb-type assignment is also possible, wherein the components of the output signal may be assigned to a comb of sub-carriers of the OFDM frequency range, that is the assigned OFDM sub-carriers are not arranged adjacently to one another without any gaps, but non-occupied sub-carriers may be located between them.

By analogy therewith, embodiments may comprise an OFDM receiver. The OFDM receiver may have a frequency despreader connected downstream from it so as to despread receive symbols that are spread in the frequency. The dimension of the frequency despreader may be smaller than a number of sub-carriers of the OFDM receiver.

In further embodiments, the components of the output signal of the frequency spreader may be assigned to several subblocks of sub-carriers of the OFDM system. The sub-carriers occupied by the components of the output signal may be occupied in an incomplete manner, i.e. single or several sub-carriers may be unoccupied in a block of the sub-carriers occupied by the components, or may be occupied by other signals. Said sub-carriers offer the possibility of transmitting other signals, also while making use of frequency diversity. Said other signals may be control signals, for example, by means of which system information, paging information, control instructions, etc. is/are transmitted. In embodiments, said sub-carriers may be used for transmitting pilot symbols, for example. In this context, an advantage of embodiments is that the individual sub-carriers may be selected such that pilot or reference symbols may be transmitted via same and that frequency diversity may be benefited from via same. In other words, the components may be distributed in the frequency range, i.e. across the OFDM carriers of the system that are available, and thus make use of frequency diversity. In addition, pilot symbols and other system information may also be spread across the frequency range so that a spreading gain may be utilised also with regard to the system information and control signals.

Embodiments using pilot symbols that are distributed in the frequency range in such a manner may enable, for example, channel estimation in the frequency range. In other words, in an embodiment, the sub-carriers occupied with pilot or reference symbols may be selected such that their distance in the frequency range does not exceed the coherence bandwidth of the radio channel. This results in that in such embodiments, the pilot symbols in the frequency range may be used as nodes of the channel, and that interpolation may be performed between the resulting channel estimations in the frequency range. If, in embodiments, the channel has been estimated in the frequency range, the associated data may now be equalized in the frequency range as well. This offers decisive advantages in signal processing following channel estimation, since equalization may be performed at lower cost and effort in the frequency range than in the time domain. In one embodiment, simple equalization in the frequency range may be achieved in performing a multiplication by an inverse channel estimation matrix, or an inverse transmission matrix.

Thus, embodiments offer the advantage that they may be used, on account of utilization of an OFDMA system along with frequency spreading of the components of the output signal of the frequency spreader, for enabling frequency range equalization. This is advantageous specifically in the case of a broadcast scenario, since frequency range equalization is less costly and is mostly implemented on mobile units that offer fewer computing and power resources. Thus, more efficient signal processing and/or improved transmission quality may be enabled.

As compared to conventional frequency spreading systems, embodiments have the advantage that single sub-carriers may be occupied with, e.g., pilot or reference symbols or other signals or symbols. As a result, various associations of data and pilots and other control channels with the sub-carriers of the OFDMA system are feasible, as was already described above. Conventional systems mostly do not allow frequency range equalization, since in said systems, all of the signals are spread across the same frequency range, i.e. across the same bandwidth. Thus, said signals cannot be isolated from one another in the frequency range, since they mutually superimpose there. It is only a corresponding spreading, which actually does leave gaps for pilot symbols, which enables estimation and equalization in the frequency range.

Embodiments further offer the advantage that a synergy effect results between frequency spreading of broadcast data and channel estimation, or equalization, in the frequency range. By making use of the frequency diversity, for example power ratios adjusted between the individual substreams may be kept stable, as was already described above. Subsequent signal processing in the frequency range enables making effective use of frequency diversity in the frequency range already, so that, even in total, more robust transmission and, as a consequence, increased system capacity and/or system stability and transmission range may result.

In embodiments, the receiver may consequently have a channel estimator for estimating an OFDM transmission channel in the frequency range.

In embodiments, the size of the area to be supplied as well as the throughput may generally be scaled via selection of the transmission techniques, for example MIMO multiplexing or STC, different SFN cells, etc. The essential points of the method shall be explained once again with reference to FIG. 10. FIG. 10 shows a video source 1000 which feeds video data to a video coder 1002 which may be implemented as an H.264/SVC coder, for example. The output of the video coder 1002 will then have, e.g., the individual substreams of the SVC media data stream located thereat, which may subsequently be coded and/or be provided with redundancies within the context of forward error correction in block 1004. In other words, different redundancies are added to the different substreams by the block. Binary data streams will then be present at the output of the coder 1004. The individual layers of the SVC video stream are then separated from one another by means of different IQ modulations in the IQ modulator 1006 in that the IQ modulator 1006 bijectively maps e.g. symbols, such single or a group of successive bits, of the substreams to constellation points of the modulation process associated with the respective substream, the modulation processes being suitably selected, as was mentioned above, so that the IQ modulator may ensure that, given the same SNR at the receiver, different bit error rates will result for the individual streams. The output of the modulator 1006 will then have symbol streams, namely one for each substream, located thereat, which may be subject to power scaling in the power scaler 1008, as was described above. Power-scaled symbol streams will then be present at the output of the power scaler 1008. Embodiments thus offer the advantage that by means of additionally scaling the transmit power for the individual substreams accurate adjustment of the desired minimum bit error rate becomes possible for each layer at the receiver.

The scaled symbol streams are supplied to an SC-FDM assigner 1010 which demultiplexes the individual symbols of the substreams so as to supply them to the DFT spreader 1012. Embodiments offer the advantage that, due to the DFT spreading in the broadcast channel of the downlink of a mobile radiocommunication system, the multipath and SFN diversity may be taken advantage of.

Embodiments further offer the advantage that the choice of the modulation process and of power scaling may be rendered dependent on the current bit rate of the respective SVC layer. The inputs of the DFT 1012, i.e. the available resources, may thus be adaptively allocated to the individual streams, for example by means of allocation methods. This is also referred to as scheduling. For the video signal, this means, in embodiments, that both variable bit rates for each layer and for statistical multiplexing may be supported.

In other words, the apparatus for assigning may further comprise, in embodiments, a means for assigning radio resources. In embodiments, the means for assigning radio resources may be adapted to assign radio resources to the first transmission symbols and to the second transmission symbols so as to balance off variable data rates of the first substream and of the second substream.

The means for associating radio resources, which may also be referred to as a scheduler in the following, associates radio resources with those transmission symbols that previously were associated with the corresponding information symbols of the data substreams, i.e. of the first substream and of the second substream.

Radio resources at this point are to be understood to mean any radio resources such as, e.g., one or more radio resources from the group of frequencies, sub-carriers, time slots, spreading sequences, codes, spatial sub-channels, directions, frequencies, antennas, hopping sequences, interleaver sequences, powers, etc. In embodiments, a scheduler may thus quickly adapt, or perform, association of radio resources with the actual transmission symbols, in which process frequency spreading need not be dispensed with.

In a simple embodiment, for example different numbers of sub-carriers may be associated with the transmission symbols of the data substreams; in this context, it is not necessary to dispense with interleaving or expanding in the frequency range. Said association of the sub-carriers and the spreading, which thus becomes possible, in the frequency range, may be combined at low cost with associating other radio resources. In simple embodiments, one in five sub-carriers of an OFDMA system might be associated, e.g., with the transmission symbols of the first substream. If the data rate in the first substream increases, i.e. if more transmission or radio resources may be used, for example one in four sub-carriers of the OFDMA system might be associated with the transmission symbols, which are now associated at higher rates.

By analogy, in embodiments, sub-carriers may also be split up between the two substreams. In other words, embodiments may change the number of associated sub-carriers of an OFDMA system between the substreams.

In simple embodiments, it would be feasible to associate, e.g., two-thirds of a number of sub-carriers with the first transmission symbols, whereas only one-third of the sub-carriers are associated with the second transmission symbols. In one embodiment, this might enable transmitting more redundancy with regard to the first substream, which redundancy may be evaluated accordingly at the receiver, so that, for the first transmission symbols, the above-mentioned channel having the lower error probability will result.

Embodiments may thus allow advantageous adaptation of the association of radio resources with the first and second transmission symbols. As a result, radio resources, in particular sub-carriers of an OFDMA system, may be employed more efficiently; for example, channel estimation in the frequency range may be enabled. Overall, a more robust system, improved transmission quality, and/or larger transmission range may result from said variable association.

Embodiments further offer the advantage that the largest of the DFTs may be adapted to the entire bandwidth available. The inputs of the DFT coder or spreader 1012 may be used as primary resources for adaptive subdivision of the SVC video streams. A one-carrier signal composed of several waveforms will then be yielded as the resulting waveform. Said signal is also referred to as a single-carrier signal.

In accordance with FIG. 10, the signal thus obtained is identified to various antennas of a base station by means of a space-time coder 1014 realizing, e.g., the Almouti concept. Beforehand, pilot symbols, which will then enable channel estimation at the receiver, are inserted into the signal by a pilot unit 1016. FIG. 10 further shows that the space-time-coded output signals comprising the pilot symbols are transformed, in two IFFTs 1018, to the time domain, where they are then distributed to the individual base stations via an SFN distributer 1020.

Embodiments further offer the advantage that, in addition to space-time coding, cross-polarized antennas may enable additional diversity gains. Alternatively, space-time multiplexing may also be used, for example for smaller cells. Various spatial streams may then be generated; the throughput will increase, whereas the size of the area supplied, i.e. the transmission range, will go down.

The SFN (single-frequency network) distributer 1020 of FIG. 4 synchronizes adjacent base stations in a single-frequency network, so that they will emit synchronized identical signals.

The pilot signals in the frequency range may enable the receiver, in embodiments, to estimate the channel. An added guard interval prevents inter-symbol interference. This is also referred to as a cyclic prefix.

The signals are then received by a mobile radiocommunication receiver 1022. Initially, the signals are transformed to the frequency range via the two FFTs 1024. In the frequency range, pilot symbols may be extracted and supplied to a channel estimator 1026. On the basis of the output of the channel estimator 1026, a frequency range equalizer 1028 may equalize the data, for example on the basis of an MMSE rule. The MMSE equalizer 1028 has a DFT despreader 1030 connected downstream from it, which may also be implemented as an inverse DFT that transforms the equalized signal to the time domain. The individual streams may thus be once again separated from one another in an SCFDM multiplexer 1032. Inverse power scaling 1034 may now be performed on the substreams of transmission symbols, said inverse power scaling 1034 being followed by an IQ demodulator 1036. Binary signals will then result. The binary signals may be corrected via a channel decoder and detector, or by an error correction 1038. The decoded binary streams may then have a CRC-based rate adapter 1040 connected downstream from them which enables, via an inserted CRC (cyclic redundancy check) check sequence, performing error detection in the individual layers.

Relatively high defective SVC layers are then discarded. Error-free low layers are decoded, and the video may be output at a reduced quality or be decoded in a decoder 1042.

Embodiments of the present invention thus offer the advantage that adaptation to the channel may be performed in the receiver. If the channel quality goes down, the error rate in the higher layers will go up. If they are discarded, the reception quality will thus automatically adapt to the channel quality.

Link- and system-level simulations confirm the potential of embodiments of the present invention. Results based on a link-level simulation in a 3 echo Rayleigh channel and 3SVC layer clearly demonstrate the advantages of embodiments, since the reproduction quality of a media content may be increased in dependence on a signal-to-noise ratio at the receiver.

Embodiments of the present invention may be employed, for example, in mobile radio networks or in WIMAX and 3GLTE networks. Various embodiments combine various diversity concepts such as, e.g., space-time coding, DFT spreading, and SC-FDM mappings so as to enable improved transmission qualities and/or more reliable transmissions in wireless multimedia broadcast networks or scenarios.

It shall be noted that, depending on the conditions, the inventive scheme may also be implemented in software. Implementation may be on a digital storage medium, in particular on a disc, a CD, a DVD, a flash memory, etc., having electronically readable control signals which may cooperate with a programmable computer system such that the corresponding method is performed. Generally, the invention thus also consists in a computer program product having a program code, stored on a machine-readable carrier, for performing the inventive method, when the computer program product runs on a computer. In other words, the invention may thus be realized as a computer program having a program code for performing the method, when the computer program product runs on a computer or processor.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A transmitter comprising an apparatus for assigning transmission symbols to a media data stream of information symbols, the media data stream comprising a first substream for representing a media content in a basic quality and a second substream comprising additional data for representing the media content, along with the first data stream, in an improved quality, comprising:
    a first assigner configured to assign first transmission symbols to the information symbols of the first substream;
    a second assigner configured to assign second transmission symbols to the information symbols of the second substream;
    a frequency spreader configured to superimpose the transmission symbols of the first and second substreams in a shared frequency range including a plurality of OFDM (orthogonal frequency division multiplexing) carriers, respectively, to obtain an output signal, by transforming the transmission symbols of the first and second substreams with DFT (discrete Fourier transform) spreading sequences together defining a DFT, respectively, to obtain transformed symbols for each transmission symbol of the first and second substreams, respectively, and superimposing the transformed symbols by addition on a per OFDM carrier basis in the shared frequency range;
    an OFDM transmitter configured to transmit the transmission symbols that are superimposed in the shared frequency range via a radio channel as the transmission channel; and
    an assigner configured to assign, by scheduling, radio resources in the form of inputs of the DFT that are adapted to assign radio resources to the first transmission symbols and to the second transmission symbols, and to balance variable data rates of the first substream and of the second substream; wherein
    the first transmission symbols are transmissible, via a transmission channel, with reduced error probability as compared to the second transmission symbols; and
    the transmitter is configured to transmit the first and second transmission symbols as broadcast transmissions.

2. The transmitter as claimed in claim 1, wherein the first transmission symbols originate from an m.ary modulation alphabet and the second transmission symbols originate from an n.ary modulation alphabet, wherein m≤n and m and n are natural numbers.

3. The transmitter as claimed in claim 1, wherein the media data is SVC (scalable video coding) encoded video data, and the first substream and the second substream correspond to different layers of the encoded video data.

4. The transmitter as claimed in claim 1, further comprising a channel coder configured to add redundancy to the first and the second substreams so that the added redundancy is different for the first and second substreams.

5. The transmitter as claimed in claim 1, further comprising a power controller configured to associate different transmit powers with the transmission symbols of the first and of the second substreams.

6. The transmitter as claimed in claim 1, further comprising a space-time coder configured to code the transmission symbols in the space-time domain.

7. The transmitter as claimed in claim 1, wherein:
    the radio channel used by the OFDM transmitter is an OFDM transmission channel that has a bandwidth broader than a bandwidth of the output signal; and
    the OFDM transmitter is configured to transmit the output signal via a plurality of OFDM sub-carriers with the plurality of OFDM sub-carriers being spread across the OFDM carriers of the OFDM transmission channel along with pilot symbols, such that an estimation of the OFDM transmission channel in the shared frequency range is able to be determined.

8. A method of assigning radio resources to transmission symbols, and assigning transmission symbols to a media data stream of information symbols, the media data stream comprising a first substream for representing a media content in a basic quality and a second substream comprising additional data for representing the media content, along with the first data stream, in an improved quality, comprising:

assigning first transmission symbols to the information symbols of the first substream;

assigning second transmission symbols to the information symbols of the second substream, the first transmission symbols being transmissible, via a transmission channel, with reduced error probability as compared to the second transmission symbols;

superimposing the transmission symbols of the first and second substreams in a shared frequency range comprising a plurality of OFDM (orthogonal frequency division multiplexing) carriers, respectively, to obtain an output signal, by transforming the transmission symbols of the first and second substreams with DFT (discrete Fourier transform) spreading sequences together defining a DFT, respectively, to obtain transformed symbols for each transmission symbol of the first and second substreams, respectively, and superimposing the transformed symbols by addition on a per OFDM carrier basis in the shared frequency range;

transmitting the transmission symbols that are superimposed in the shared frequency range by OFDM transmission via a radio channel as the transmission channel;

assigning, by scheduling, radio resources in the form of inputs of the DFT to the first transmission symbols and to the second transmission symbols to balance variable data rates of the first substream and of the second substream; and transmitting the first and second transmission symbols as broadcast transmissions.

9. A non-transitory computer readable medium having stored thereon a computer program comprising program code for performing, when the program code runs on a computer or processor, a method of assigning radio resources to transmission symbols, and assigning transmission symbols to a media data stream of information symbols, the media data stream comprising a first substream for representing a media content in a basic quality and a second substream comprising additional data for representing the media content, along with the first data stream, in an improved quality, the method comprising:

assigning first transmission symbols to the information symbols of the first substream;

assigning second transmission symbols to the information symbols of the second substream, the first transmission symbols being transmissible, via a transmission channel, with reduced error probability as compared to the second transmission symbols;

superimposing the transmission symbols of the first and second substreams in a shared frequency range comprising a plurality of OFDM (orthogonal frequency division multiplexing) carriers, respectively, to obtain an output signal, by transforming the transmission symbols of the first and second substreams with DFT (discrete Fourier transform) spreading sequences together defining a DFT, respectively, to obtain transformed symbols for each transmission symbol of the first and second substreams, respectively, and superimposing the transformed symbols by addition on a per OFDM carrier basis in the shared frequency range;

transmitting the transmission symbols that are superimposed in the shared frequency range by OFDM transmission via a radio channel as the transmission channel;

assigning, by scheduling, radio resources in the form of inputs of the DFT to the first transmission symbols and to the second transmission symbols to balance variable data rates of the first substream and of the second substream; and transmitting the first and second transmission symbols as broadcast transmissions.

10. An apparatus for estimating a media data stream on the basis of a stream of receive symbols broadcasted wirelessly using OFDM (orthogonal frequency division multiplexing), comprising:

a demultiplexer configured to split up the stream of receive symbols from a superposition in a shared frequency range including a plurality of OFDM carriers of a receive signal into at least a first symbol substream and a second symbol substream by transforming receive symbols at the plurality of DFT (discrete Fourier transform) carriers using DFT despreading into retransformed symbols and splitting up the retransformed symbols onto the first symbol substream and the second symbol substream;

a first symbol estimator configured to associate a first substream of information symbols of the media data stream with the first symbol substream on the basis of a first symbol alphabet; and a second symbol estimator configured to associate a second substream of information symbols of the media data stream with the second symbol substream on the basis of a second symbol alphabet; wherein the first substream allows a media content to be represented in a basic quality, and the second substream along with the first substream allows the media content to be represented in an improved quality; and the receiver further includes an OFDM receiver.

11. The apparatus as claimed in claim 10, wherein the first symbol alphabet corresponds to an m.ary modulation alphabet and the second symbol alphabet corresponds to an n.ary modulation alphabet, wherein m≤n and m, n are natural numbers.

12. The apparatus as claimed in claim 10, wherein the media data is SVC-encoded video data, and the first substream and the second substream correspond to different layers of the encoded video data.

13. A receiver comprising an apparatus according to claim 10.

14. The apparatus as claimed in claim 10, wherein:

the OFDM receiver uses an OFDM transmission channel that has a bandwidth broader than a bandwidth of the receive signal; and the OFDM receiver is configured to receive a plurality of OFDM sub-carriers along with pilot symbols spread across the OFDM carriers of the OFDM transmission channel and to estimate the OFDM transmission channel in the shared frequency range using the pilot symbols.

15. A method of estimating a media data stream on the basis of a stream of receive symbols broadcasted wirelessly using OFDM (orthogonal frequency division multiplexing), comprising:

splitting up the stream of receive symbols from a superposition in a shared frequency range including a plurality of OFDM carriers of a receive signal into at least a first symbol substream and a second symbol substream by transforming receive symbols at the plurality of DFT (discrete Fourier transform) carriers using DFT despreading into retransformed symbols and splitting up the retransformed symbols onto the first symbol substream and the second symbol substream;

associating a first substream of information symbols of the media data stream with the first symbol substream on the basis of a first symbol alphabet; and associating a second substream of information symbols of the media data stream with the second symbol substream on the basis of a second symbol alphabet; wherein the first substream allows a media content to be represented in a basic quality, and the second substream along with the first substream allows the media content to be represented in an improved quality; and the method further includes a step of performing OFDM reception.

16. A non-transitory computer readable medium having stored thereon a computer program comprising program code for performing, when the program code runs on a computer or a processor, a method of estimating a media data stream on the basis of a stream of receive symbols broadcasted wirelessly using OFDM (orthogonal frequency division multiplexing), the method comprising:

splitting up the stream of receive symbols from a superposition in a shared frequency range including a plurality of OFDM carriers of a receive signal into at least a first symbol substream and a second symbol substream by transforming receive symbols at the plurality of DFT (discrete Fourier transform) carriers using DFT despreading into retransformed symbols and splitting up the retransformed symbols onto the first symbol substream and the second symbol substream;

associating a first substream of information symbols of the media data stream with the first symbol substream on the basis of a first symbol alphabet; and associating a second substream of information symbols of the media data stream with the second symbol substream on the basis of a second symbol alphabet the first substream allows a media content to be represented in a basic quality, and the second substream along with the first substream allows the media content to be represented in an improved quality, the method further includes a step of performing OFDM reception.

17. A system comprising:

a transmitter comprising an apparatus for assigning transmission symbols to a media data stream of information symbols, the media data stream comprising a first substream for representing a media content in a basic quality and a second substream comprising additional data for representing the media content, along with the first data stream, in an improved quality, the transmitter comprising:

a first assigner configured to assign first transmission symbols to the information symbols of the first substream;

a second assigner configured to assign second transmission symbols to the information symbols of the second substream;

a frequency spreader configured to superimpose the transmission symbols of the first and second substreams in a shared frequency range including a plurality of OFDM (orthogonal frequency division multiplexing) carriers, respectively, to obtain an output signal, by transforming the transmission symbols of the first and second substreams with DFT spreading sequences together defining a DFT, respectively, to obtain transformed symbols for each transmission symbol of the first and second substreams, respectively, and superimposing the transformed symbols by addition on a per OFDM carrier basis in the shared frequency range;

an OFDM transmitter configured to transmit the transmission symbols that are superimposed in the shared frequency range via a radio channel as the transmission channel; and an assigner configured to assign, by scheduling, radio resources in the form of inputs of the DFT that are adapted to assign radio resources to the first transmission symbols and to the second transmission symbols, and to balance variable data rates of the first substream and of the second substream; wherein the first transmission symbols are transmissible, via a transmission channel, with reduced error probability as compared to the second transmission symbols; and the transmitter is configured to transmit the first and second transmission symbols as broadcast transmissions; and a receiver comprising an apparatus for estimating a media data stream on the basis of a stream of receive symbols broadcasted wirelessly using OFDM, the receiver comprising:

a demultiplexer for splitting configured to split up the stream of receive symbols from a superposition in a shared frequency range including a plurality of OFDM carriers of a receive signal into at least a first symbol substream and a second symbol substream by transforming receive symbols at the plurality of DFT carriers using DFT despreading into retransformed symbols and splitting up the retransformed symbols onto the first symbol substream and the second symbol substream;

a first symbol estimator configured to associate a first substream of information symbols of the media data stream with the first symbol substream on the basis of a first symbol alphabet; and a second symbol estimator configured to associate a second substream of information symbols of the media data stream with the second symbol substream on the basis of a second symbol alphabet; wherein the first substream allows a media content to be represented in a basic quality, and the second substream along with the first substream allows the media content to be represented in an improved quality and the receiver further including an OFDM receiver.

* * * * *

UNITED STATES PATENT AND TRADEMARK OFFICE
CERTIFICATE OF CORRECTION

| | | |
|---|---|---|
| PATENT NO. | : 8,976,838 B2 | Page 1 of 1 |
| APPLICATION NO. | : 12/970990 | |
| DATED | : March 10, 2015 | |
| INVENTOR(S) | : Stephen Jaeckel et al. | |

It is certified that error appears in the above-identified patent and that said Letters Patent is hereby corrected as shown below:

In the claims

The following should be corrected in Claim 17, column 28, line 32 as follows:

"...a demultiplexer configured to split up the..."

Signed and Sealed this
Twenty-third Day of February, 2016

Michelle K. Lee
*Director of the United States Patent and Trademark Office*